(12) United States Patent

Yu et al.

(10) Patent No.: US 12,693,357 B2
(45) Date of Patent: Jul. 28, 2026

(54) TUNING DEVICE FOR RECEIVING COIL, CRYOGENIC PROBE, AND MAGNETIC RESONANCE DEVICE

(71) Applicant: WUHAN UNITED IMAGING LIFE SCIENCE INSTRUMENT CO., LTD., Wuhan (CN)

(72) Inventors: Ze Yu, Wuhan (CN); Chuo Xie, Wuhan (CN); Ou Xiong, Wuhan (CN); Hongxia Lei, Wuhan (CN); Weidong Wang, Shanghai (CN)

(73) Assignee: WUHAN UNITED IMAGING LIFE SCIENCE INSTRUMENT CO., LTD., Wuhan (CN)

( * ) Notice: Subject to any disclaimer, the term of this patent is extended or adjusted under 35 U.S.C. 154(b) by 114 days.

(21) Appl. No.: 18/614,607

(22) Filed: Mar. 22, 2024

(65) Prior Publication Data

US 2024/0230806 A1 Jul. 11, 2024

Related U.S. Application Data

(63) Continuation of application No. PCT/CN2022/121107, filed on Sep. 23, 2022.

(30) Foreign Application Priority Data

| | | | |
|---|---|---|---|
| Sep. 24, 2021 | (CN) | .......................... | 202122326429.8 |
| Oct. 22, 2021 | (CN) | .......................... | 202122558925.6 |
| Dec. 21, 2021 | (CN) | .......................... | 202111575979.1 |

(51) Int. Cl.
*G01V 3/00* (2006.01)
*G01R 33/34* (2006.01)
(Continued)

(52) U.S. Cl.
CPC ..... *G01R 33/3628* (2013.01); *G01R 33/3403* (2013.01); *G01R 33/543* (2013.01); *G01R 33/583* (2013.01)

(58) Field of Classification Search
CPC ............ G01R 33/3628; G01R 33/3403; G01R 33/543; G01R 33/583
(Continued)

(56) References Cited

U.S. PATENT DOCUMENTS

| | | | | |
|---|---|---|---|---|
| 4,161,708 A | * | 7/1979 | Friberg | ................... H03J 5/244 |
| | | | | 455/180.1 |
| 4,855,680 A | | 8/1989 | Arakawa et al. | |

(Continued)

FOREIGN PATENT DOCUMENTS

| | | | | |
|---|---|---|---|---|
| CN | 1202048 A | 12/1998 | | |
| CN | 203747766 U | * 7/2014 | ................ | H03J 3/20 |

(Continued)

OTHER PUBLICATIONS

International Search Report in PCT/CN2022/121107 mailed on Nov. 28, 2022, 8 pages.

(Continued)

*Primary Examiner* — Walter L Lindsay, Jr.
*Assistant Examiner* — Frederick Wenderoth
(74) *Attorney, Agent, or Firm* — METIS IP LLC

(57) ABSTRACT

Embodiments of the present disclosure provides a tuning device for a receiving coil, a cryogenic probe, and a magnetic resonance device. The tuning device may include a fixed capacitor, a varactor assembly, and a control assembly. The fixed capacitor and the coil may be connected in series. The varactor assembly may be connected in parallel to both ends of the fixed capacitor. The control assembly may be configured to control the capacitance of the receiving coil by controlling the capacitance value of the varactor assembly to
(Continued)

100 perform a tuning operation on the receiving coil, the tuning operation including at least one of a frequency tuning and an impedance tuning.

20 Claims, 9 Drawing Sheets

(51) Int. Cl.
 *G01R 33/36*   (2006.01)
 *G01R 33/54*   (2006.01)
 *G01R 33/58*   (2006.01)

(58) Field of Classification Search
 USPC ......................................................... 324/322
 See application file for complete search history.

(56)       References Cited

U.S. PATENT DOCUMENTS

| | | | |
|---|---|---|---|
| 5,589,844 | A | 12/1996 | Belcher et al. |
| 6,744,324 | B1 | 6/2004 | Adams et al. |
| 10,653,335 | B2 | 5/2020 | Dohata et al. |
| 2003/0173966 | A1 | 9/2003 | Scott et al. |
| 2012/0259323 | A1 * | 10/2012 | Manwaring ........ A61B 18/1206 |
| | | | 606/27 |
| 2014/0210475 | A1 | 7/2014 | Li et al. |
| 2015/0357831 | A1 * | 12/2015 | Fiorello .................. H02J 50/60 |
| | | | 307/104 |
| 2018/0277960 | A1 | 9/2018 | Johnsson et al. |
| 2019/0379340 | A1 | 12/2019 | Rattan et al. |

FOREIGN PATENT DOCUMENTS

| | | | |
|---|---|---|---|
| CN | 104753187 | A | 7/2015 |
| CN | 107959357 | A | 4/2018 |
| CN | 216090475 | U | 3/2022 |
| CN | 216285675 | U | 4/2022 |
| JP | H05244058 | A | 9/1993 |
| JP | H0654308 | U | 7/1994 |
| JP | 2009216578 | A * | 9/2009 |

OTHER PUBLICATIONS

Written Opinion in PCT/CN2022/121107 mailed on Nov. 28, 2022, 8 pages.
First Office Action in Chinese Application No. 202111575979.1 mailed on Sep. 10, 2025, 15 pages.
The Second Office Action in Chinese Application No. 202111575979.1 mailed on Apr. 17, 2026, 15 pages.

* cited by examiner

100

200

300

400

500

600

700

800

900

1000

1100

1200

Obtaining a sweep reflection coefficient curve generated after a receiving coil is swept, the sweep reflection coefficient curve including reflection coefficients of the receiving coil at different sweep frequencies ⟍ S211

Updating a first capacitance value by adjusting a first voltage ⟍ S212

Updating, based on the updated first capacitance value, the sweep reflection coefficient curve and generating a first reflection coefficient curve corresponding to the updated first capacitance value ⟍ S213

No ← Whether the first reflection coefficient curve satisfies a first preset condition of a frequency tuning? ⟍ S214

Yes end

FIG. 12

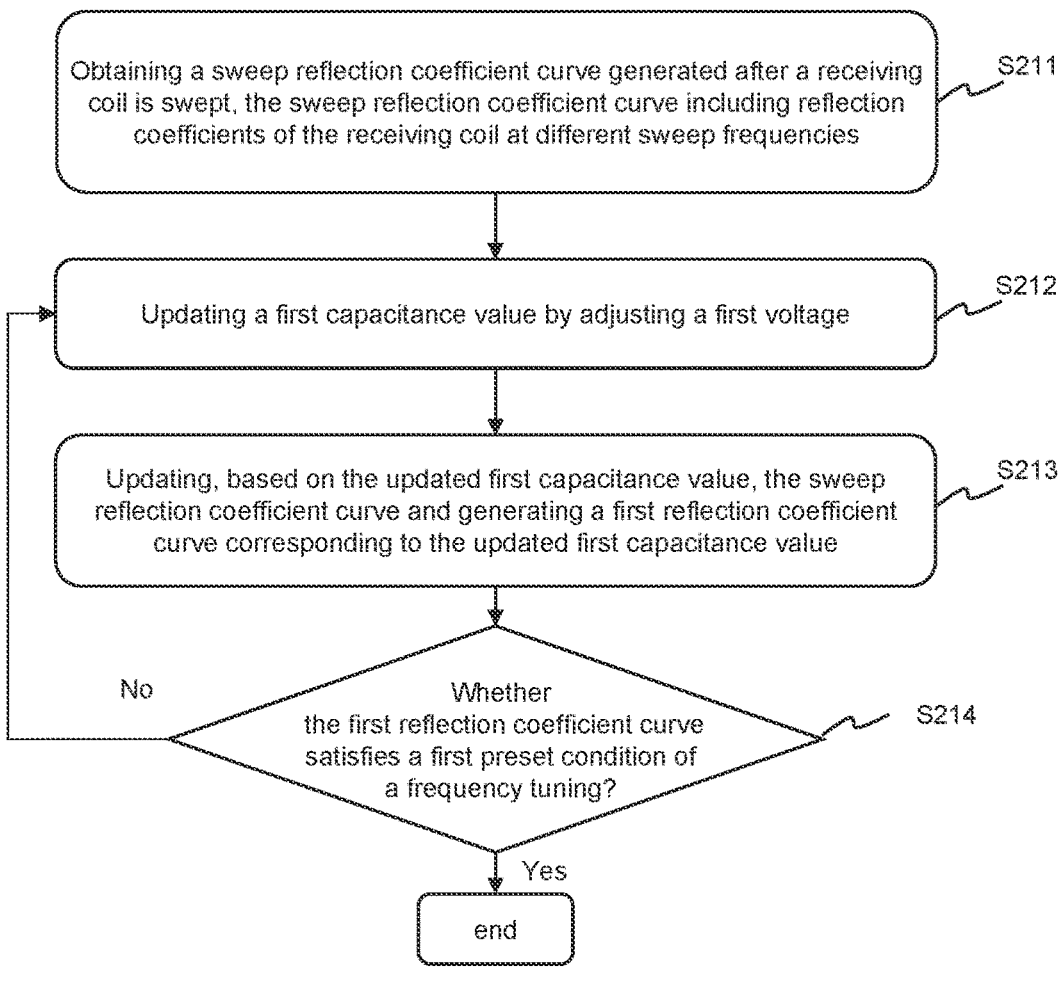

FIG.13

Reflection coefficient frequency/MHz

1500

1600

1

TUNING DEVICE FOR RECEIVING COIL, CRYOGENIC PROBE, AND MAGNETIC RESONANCE DEVICE

CROSS-REFERENCE TO RELATED APPLICATION

This application is a Continuation of International Application No. PCT/CN2022/121107, filed on Sep. 23, 2022, which claims priority to Chinese application No. 202111575979.1 filed on Dec. 21, 2021, Chinese application No. 202122326429.8 filed on Sep. 24, 2021, and Chinese application No. 202122558925.6 filed on Oct. 22, 2021, the entire contents of each of which are incorporated herein by reference.

TECHNICAL FIELD

The present disclosure relates to the field of magnetic resonance, and in particular to a tuning device for a receiving coil, a cryogenic probe, and a magnetic resonance device.

BACKGROUND

A receiving coil is an important component of a magnetic resonance imaging (MRI) system, which is used to receive an electromagnetic signal from a scanned object during a scan and transmit the electromagnetic signal to a preamplifier to generate a corresponding scan image. As a receiving coil (such as a receiving coil of a cryogenic probe) is extremely sensitive to a magnitude of a load, a change in the scanned object during a scan may result in a change in a resonant frequency of the receiving coil or a deterioration of an impedance match, which leads to an undesired scanning result, e.g., a deterioration in a signal-to-noise (SNR) ratio of the image. Therefore, a frequency tuning and an impedance tuning for the receiving coil are usually performed before scanning different objects.

SUMMARY

One of the embodiments of the present disclosure provides a tuning device for a receiving coil. The tuning device may include a fixed capacitor, a varactor assembly, and a control assembly. The fixed capacitor may be connected in series to the receiving coil. The varactor assembly may be connected in parallel to both ends of the fixed capacitor. The control assembly may be configured to perform a tuning operation on the receiving coil by controlling a capacitance value of the varactor assembly, the tuning operation including at least one of a frequency tuning and an impedance tuning.

One embodiment of the present disclosure provides a cryogenic probe, including the tuning device for the receiving coil described in any embodiment of the present disclosure.

One embodiment of the present disclosure provides a magnetic resonance device, including a cryogenic probe described in any embodiment of the present disclosure.

BRIEF DESCRIPTION OF THE DRAWINGS

The present disclosure will be further illustrated by way of exemplary embodiments, which will be described in detail utilizing the accompanying drawings. These embodi-

Figure 1:
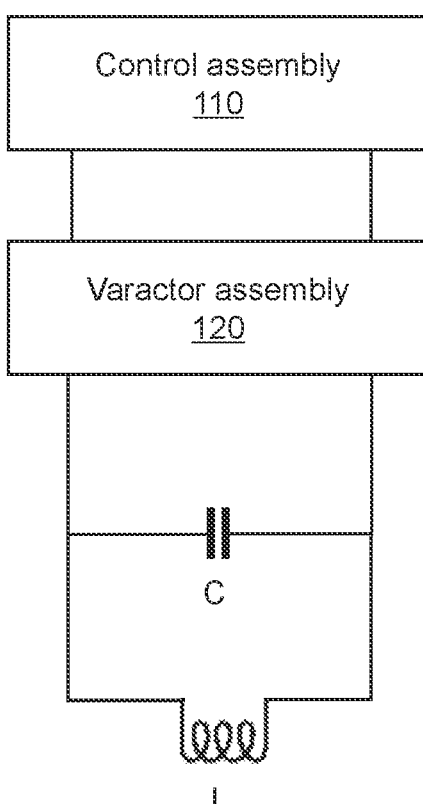
Figure 2:
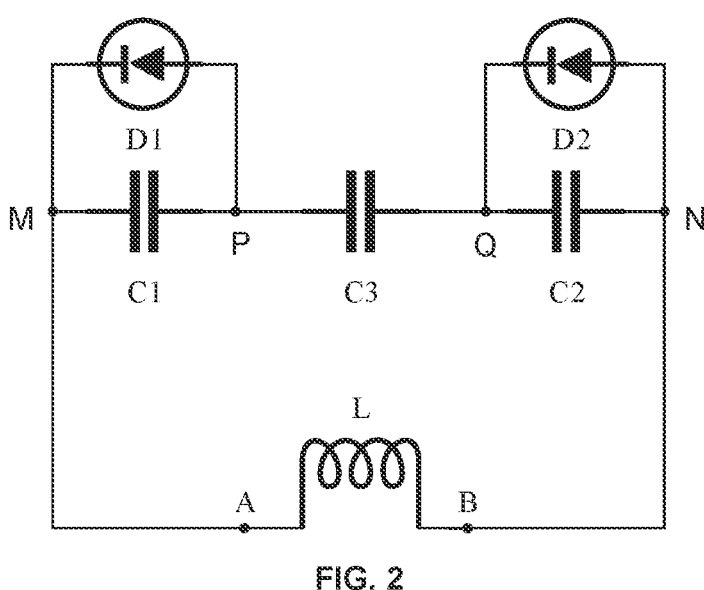
Figure 3:
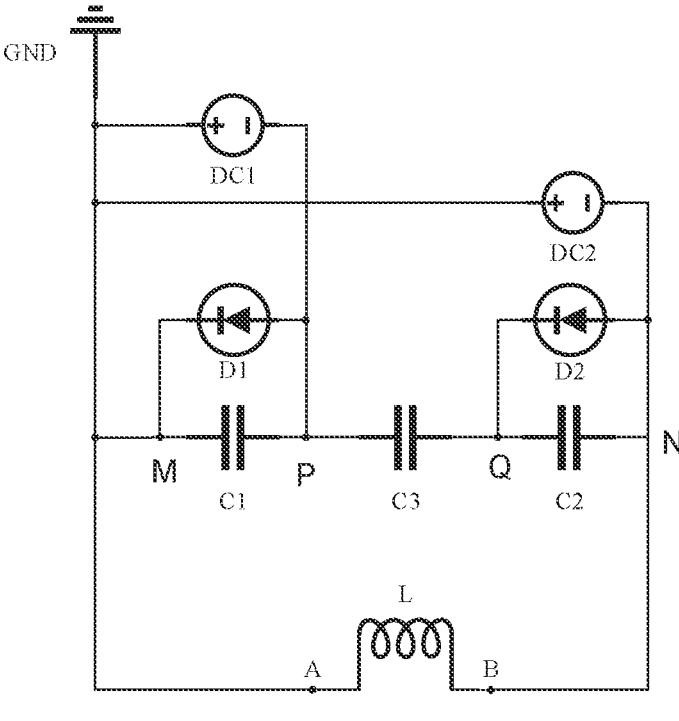
Figure 4:
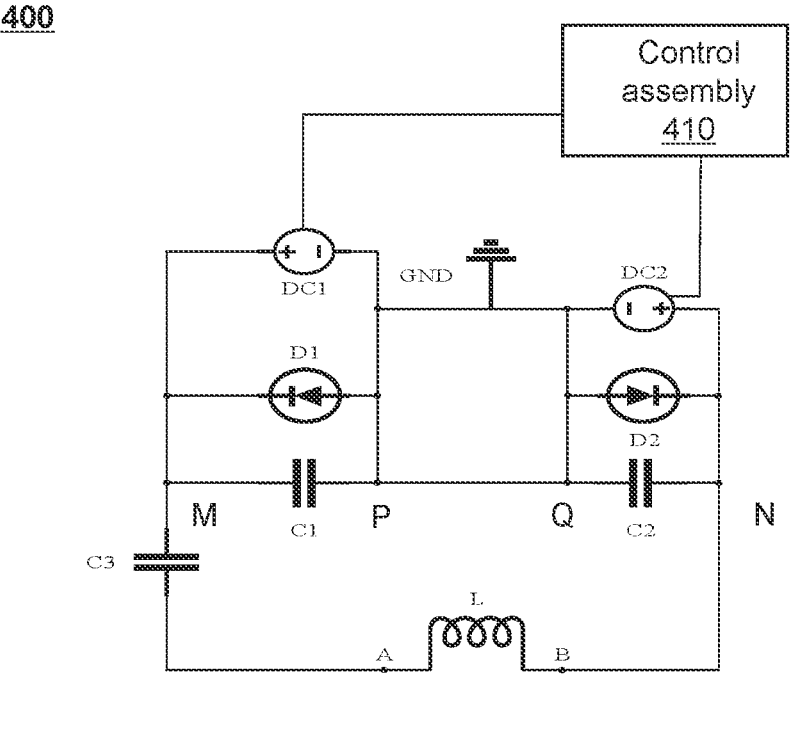
Figure 5:
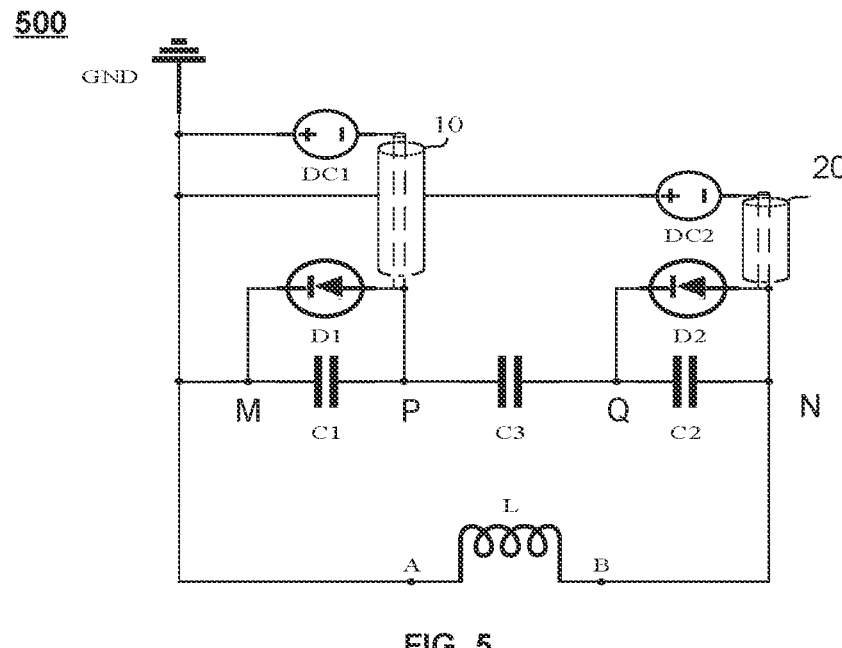
Figure 6:
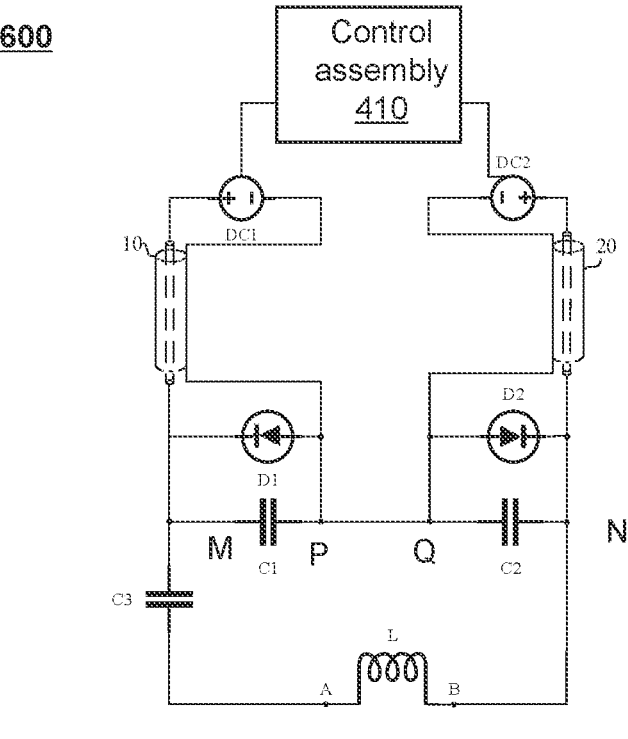
Figure 7:
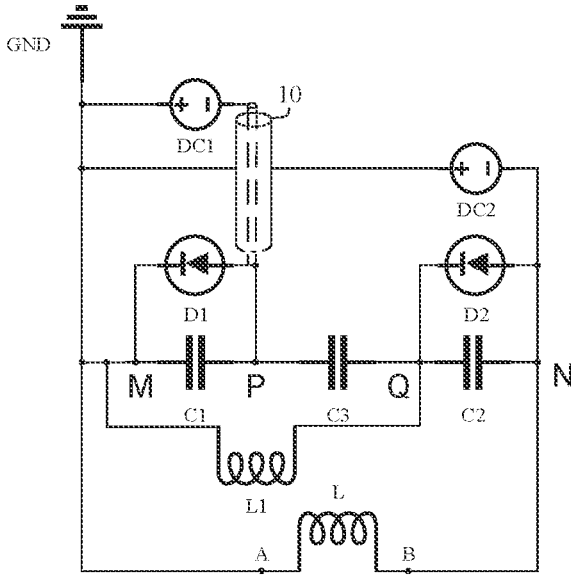
Figure 8:
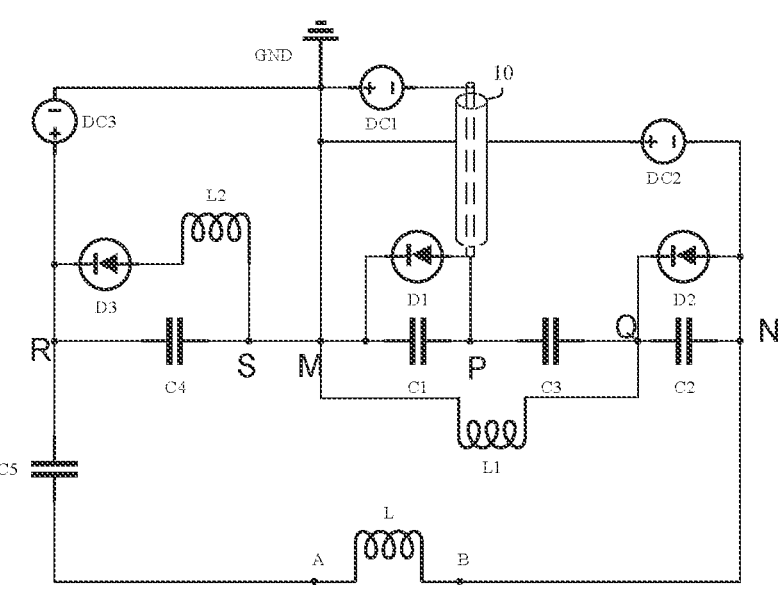
Figure 9:
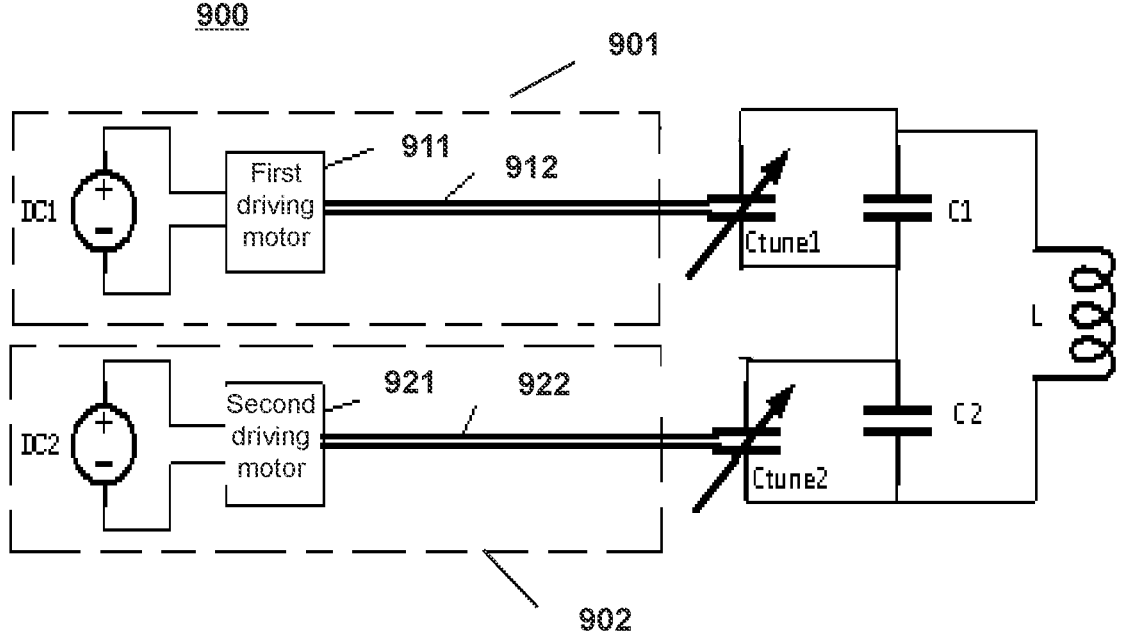
Figure 10:
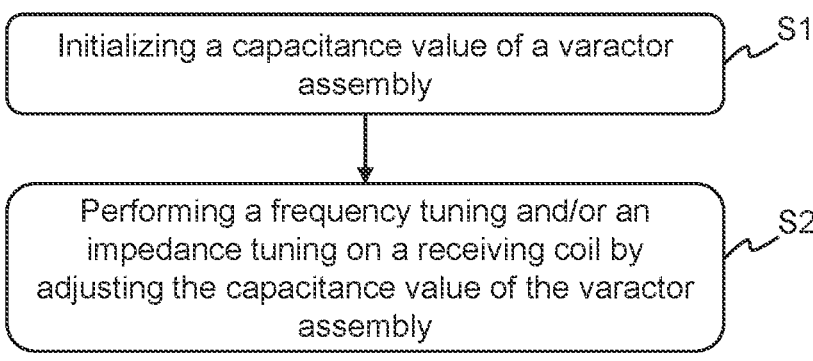
Figure 11:
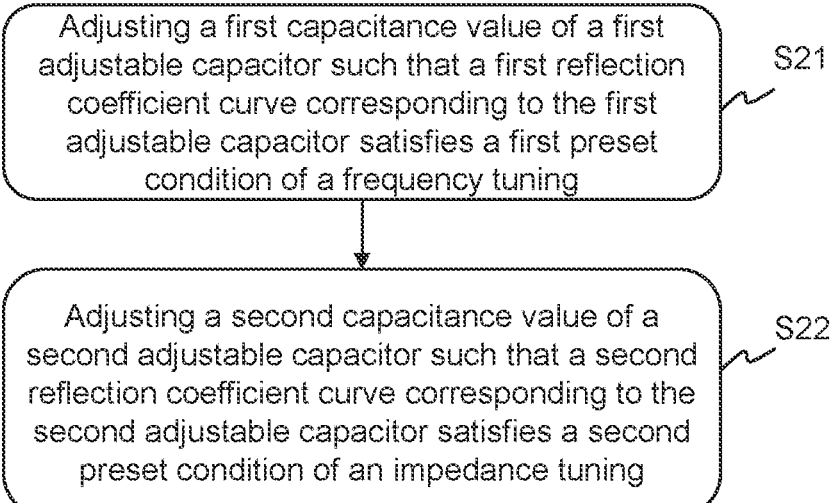
Figure 14:
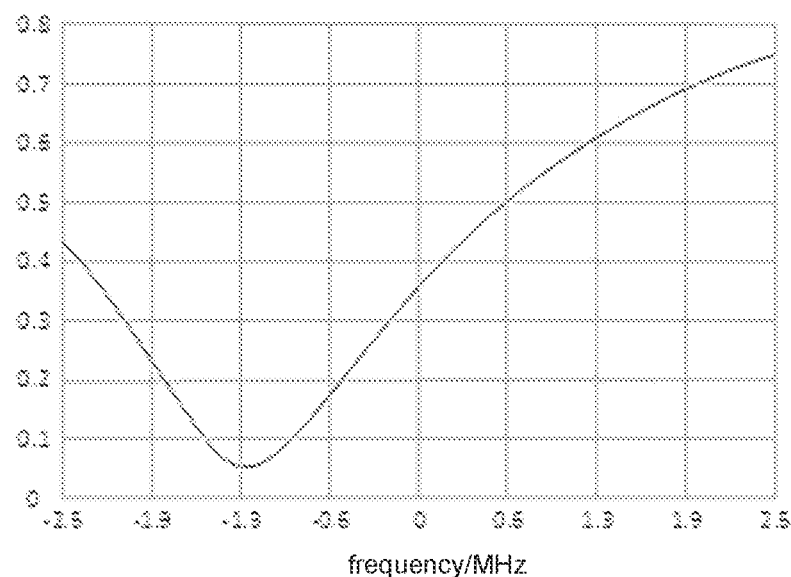
Figure 15:
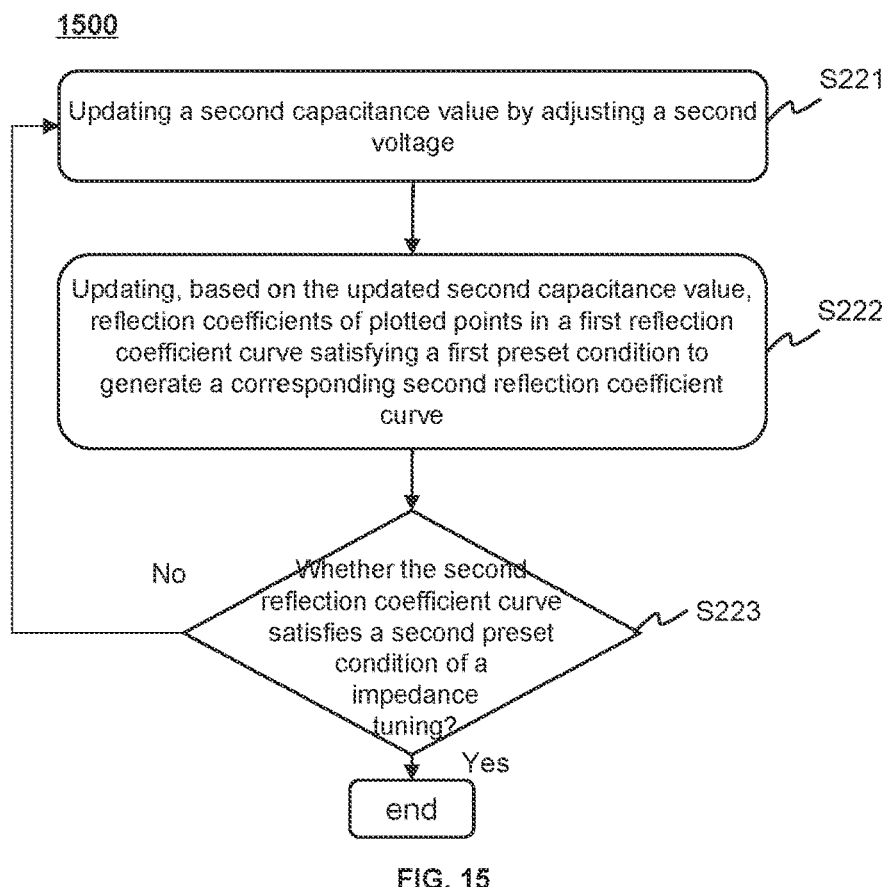
Figure 16:
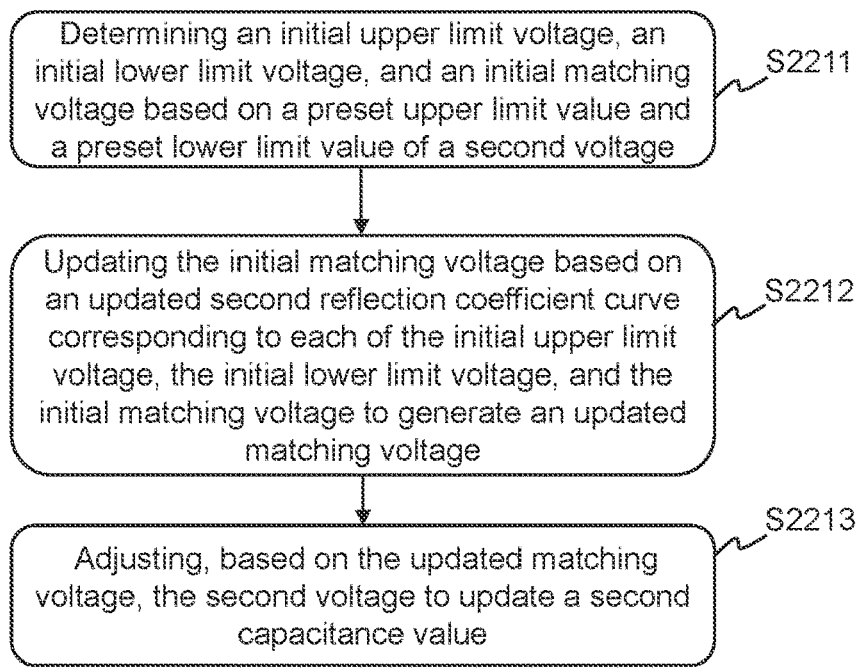

2 ments are not limiting, and in these embodiments, the same numbering denotes the same structure, wherein:

FIG. 1 is a schematic diagram illustrating an exemplary tuning device for a receiving coil according to some embodiments of the present disclosure;

FIG. 2 is a circuit diagram illustrating an exemplary tuning device for a receiving coil according to some embodiments of the present disclosure;

FIG. 3 is a circuit diagram illustrating an exemplary tuning device for a receiving coil according to some embodiments of the present disclosure;

FIG. 4 is a circuit diagram illustrating an exemplary tuning device for a receiving coil according to some embodiments of the present disclosure;

FIG. 5 is a circuit diagram illustrating an exemplary tuning device for a receiving coil according to some embodiments of the present disclosure;

FIG. 6 is a circuit diagram illustrating an exemplary tuning device for a receiving coil according to some embodiments of the present disclosure;

FIG. 7 is a circuit diagram illustrating an exemplary tuning device for a receiving coil according to some embodiments of the present disclosure;

FIG. 8 is a circuit diagram illustrating an exemplary tuning device for a receiving coil according to some embodiments of the present disclosure;

FIG. 9 is a circuit diagram illustrating an exemplary tuning device for a receiving coil according to some embodiments of the present disclosure;

FIG. 10 is a flowchart illustrating an exemplary process for tuning a receiving coil according to some embodiments of the present disclosure;

FIG. 11 is a flowchart illustrating an exemplary process for adjusting a first capacitance value of a first adjustable capacitor and a second capacitance value of a second adjustable capacitor according to some embodiments of the present disclosure;

FIG. 12 is a flowchart illustrating an exemplary process for adjusting a first capacitance value of a first adjustable capacitor according to some embodiments of the present disclosure;

FIG. 13 is a schematic diagram illustrating an exemplary sweep circuit for a sweep frequency according to some embodiments of the present disclosure;

FIG. 14 is a schematic diagram illustrating an exemplary sweep reflection coefficient curve according to some embodiments of the present disclosure;

FIG. 15 is a flowchart illustrating an exemplary process for tuning a receiving coil according to some embodiments of the present disclosure; and FIG. 16 is a flowchart illustrating an exemplary process for tuning a receiving coil according to some embodiments of the present disclosure.

DETAILED DESCRIPTION

In order to more clearly illustrate the technical solutions of the embodiments of the present disclosure, the following will briefly describe the accompanying drawings to be used in the description of the embodiments. Obviously, the accompanying drawings in the following description are only some examples or embodiments of the present disclosure, and it is possible for those skilled in the art to apply the present disclosure to other similar scenarios in accordance with these drawings without creative labor. The present disclosure may be applied to other similar scenarios based on these drawings without creative labor. Unless obviously obtained from the context or the context illustrates otherwise, the same numeral in the drawings refers to the same structure or operation.

It should be understood that the terms "system," "device," "unit," and/or "module" as used herein are a way to distinguish between different components, elements, parts, sections, or assemblies at different levels. However, the words may be replaced by other expressions if other words accomplish the same purpose.

As shown in the present disclosure and the claims, unless the context clearly suggests an exception, the words "a," "an," "one," and/or "the" do not refer specifically to the singular, but may also include the plural. Generally, the terms "including" and "comprising" suggest only the inclusion of clearly identified steps and elements. In general, the terms "including" and "comprising" only suggest the inclusion of explicitly identified steps and elements that do not constitute an exclusive list, and the method or apparatus may also include other steps or elements.

Flowcharts are used in the present disclosure to illustrate operations performed by a system according to embodiments of the present disclosure. It should be appreciated that the preceding or following operations are not necessarily performed in the exact sequence. Instead, the operations may be processed in reverse order or simultaneously. Also, it may be possible to add other operations to these processes or remove an operation or operations from them.

A frequency tuning and an impedance tuning may be performed on the receiving coil before a magnetic resonance imaging system (MRI) scan. The frequency tuning refers to an act or process of adjusting a frequency to a resonant state. By adjusting the frequency of a receiving coil to a resonant frequency, the receiving coil may resonate with a received signal. For example, an inductance value or a capacitance value of the receiving coil may be adjusted to achieve the resonant state. The resonant frequency refers to an inherent frequency of a circuit. In a circuit including a capacitance and an inductance, when a sinusoidal frequency of an input voltage reaches a particular frequency (i.e., the resonant frequency of the circuit), an inductive impedance and a capacitive impedance of the circuit may be equal. At this time, the circuit may present a pure resistance to the outside, that is, the circuit may reach the resonance state. When a resonance occurs, the circuit may amplify the input voltage by Q times, where Q denotes a quality factor, which is used to measure a loss in the circuit. The greater the Q, the smaller the loss in the circuit, and the less the noise introduced into the circuit.

The impedance tuning, also referred to as matched tuning, may be mainly used in a transmission line, where all high-frequency microwave signals are delivered to a load point by adjusting the matched impedance. An impedance match refers to that by adjusting an output impedance of the receiving coil so that the output impedance is compatible with an internal impedance of a signal source to obtain a maximum power output. A process of adjusting the inductance value or the capacitance value in the circuit to achieve the impedance match may be called the impedance tuning. The impedance tuning may effectively improve a signal-to-noise ratio (SNR) of the circuit. During the impedance tuning, few signals may be reflected back to a source point, which effectively improves energy efficiency.

Both the frequency tuning and the impedance tuning require adjusting the capacitance value or the inductance value in the receiving coil. In existing methods, the frequency tuning and the impedance tuning are usually performed manually by the user (e.g., by turning an adjustment knob of an adjustable capacitor). However, a manual tuning requires repeated manual adjustments and measurements, making the tuning process complex and time-consuming. On the other hand, for some coils with a special working environment, manual adjust cannot be carried out in that working environment. For example, when the receiving coil in a cryogenic probe is located in an ultra-cryogenic environment, such as liquid nitrogen or liquid helium, or when the receiving coil is disposed in a cryogenic vacuum cavity to maintain the ultra-cryogenic state of the receiving coil, it may be difficult for the user to manually perform the frequency tuning and the impedance tuning on the receiving coil of the cryogenic probe. At the same time, as the circuit of the receiving coil includes a variety of components such as a detuned circuit, an impedance tuning circuit, and a frequency tuning circuit, etc., which occupy a great space, it may be difficult to meet the small size requirements of the cryogenic probe, and a reliability of the cryogenic probe may be reduced. In some embodiments, a coaxial cable and a mechanical structure may be used for the frequency tuning and the impedance tuning, but this often introduces noise and increases losses of the capacitor or the coil.

Therefore, it is desirable to provide a tuning device for the receiving coil that has high applicability and efficiency in different application environments.

Embodiments of the present disclosure provide a tuning device for a receiving coil, a cryogenic probe, and a magnetic resonance device applied to an MRI system for magnetic resonance imaging. The tuning device for the receiving coil may include a fixed capacitor, a varactor assembly, and a control assembly. The varactor assembly may be connected in parallel to two ends of the fixed capacitor, and a capacitance change of the varactor assembly may be controlled through the control assembly. In such cases, the capacitance value of the circuit may be adjusted to achieve an automatic tuning process of the frequency tuning and/or the impedance tuning of the receiving coil. The tuning device provided in the present disclosure may be applied to different receiving coils, including a variety of coils working in special operating environments.

FIG. 1 is a schematic diagram illustrating an exemplary tuning device 100 for a receiving coil according to some embodiments of the present disclosure.

As shown in FIG. 1, the tuning device 100 may be configured for the frequency tuning and/or the impedance tuning of a receiving coil L. The tuning device 100 may include a control assembly 110, a varactor assembly 120, and a fixed capacitor C. The fixed capacitor C may be connected in series to the receiving coil L, the varactor assembly 120 may be connected in parallel to two ends of the fixed capacitor C, and the control assembly 110 may be used to control a capacitance value of the varactor assembly 120 to perform a tuning operation on the receiving coil L.

In some embodiments, the varactor assembly 120 may include a varactor diode. The varactor diode may be small and easy to install, which is suitable for performing a circuit tuning. When a reverse bias voltage is applied to both ends of the varactor diode, a capacitive effect may occur in the varactor diode, and the capacitance of the varactor diode may decrease as the reverse bias voltage increases. Thus, when the varactor assembly 120 is the varactor diode, the control assembly 110 may adjust the capacitance value of the varactor diode by controlling a magnitude of a voltage output to the varactor diode, thus adjusting an overall capacitance value of the circuit in which the receiving coil L is located, thereby performing the frequency tuning and/or the impedance tuning on the receiving coil L. In some embodiments, the tuning device 100 may further include a power supply for outputting the voltage to the varactor assembly 120. The control assembly 110 may adjust the capacitance value of the varactor assembly 120 to a target capacitance value by adjusting the magnitude of the voltage output from the power supply. The target capacitance value refers to a desired capacitance value of the varactor assembly 120, and when the capacitance value of the varactor assembly 120 is the target capacitance value, the varactor assembly 120 and the fixed capacitor C may form an equivalent circuit so that the capacitance formed with the receiving coil L is in a resonant state or an impedance match state. That is, when the capacitance value of the varactor capacitance assembly 120 is the target capacitance value, the receiving coil L may be successfully frequency tuned and/or impedance tuned.

In some embodiments, the varactor assembly 120 may include an adjustable capacitor. In some embodiments, the control assembly 110 may include a connecting member by which the control assembly 110 links an adjustable member of the varactor assembly 120 to adjust the capacitance value of the varactor assembly 120, thereby adjusting the overall capacitance of the circuit in which the receiving coil L is located, and performing the frequency tuning and/or the impedance tuning on the receiving coil L. In some embodiments, the varactor assembly 120 may include a capacitance circuit including a plurality of adjustable capacitors connected in parallel or in series, which is not limited to a single adjustable capacitor assembly, as long as the capacitance value thereof is capable of being changed under external forces.

In some embodiments, the control assembly 110 may determine the target capacitance value based on at least one of a resonant frequency of the receiving coil L or a target output impedance of the receiving coil L. More descriptions regarding determining the target capacitance value can be found in the subsequent descriptions of the present disclosure.

The tuning device 100 for the receiving coil L provided in the embodiments of the present disclosure ensures that the capacitance value of the entire circuit is adjustable by connecting the varactor assembly 120 in parallel to the two ends of the fixed capacitor C. The manner of directly connecting the varactor assembly 120 and the fixed capacitor C in parallel may reduce the use of cables, reduce the introduced noise, and effectively reduce the loss of the receiving coil L. Meanwhile, utilizing the control assembly 110 to adjust the capacitance of the varactor assembly 120 may avoid a manual adjustment, making the tuning device 100 applicable to any application scenario.

It may be understood that, in some embodiments, the connection between the varactor assembly 120 and the fixed capacitor C may also be in series, as long as it is possible to change the overall capacitance value of the circuit by changing the capacitance value of the varactor assembly 120 during the frequency tuning or the impedance tuning.

FIG. 2 is a circuit diagram illustrating a tuning device 200 for a receiving coil according to some embodiments of the present disclosure.

In some embodiments, the tuning device 200 for the receiving coil may include two varactor assemblies and two fixed capacitors. As shown in FIG. 2, the fixed capacitor may include a first fixed capacitor C1 and a second fixed capacitor C2, and the varactor assembly may include a first diode D1 (also referred to as a first varactor assembly) and a second diode D2 (also referred to as a second varactor assembly). The first diode D1 may be connected in parallel to both ends of the first fixed capacitor C1, and the first diode D1 and the first fixed capacitor C1 may be used for performing frequency tuning on the receiving coil L. For example, a capacitance value of the first diode D1 may be changed by adjusting electrical signals inputted at two ends of the first diode D1, so as to perform the frequency tuning on the receiving coil L. The second diode D2 may be connected in parallel to both ends of the second fixed capacitor C2, and the second diode D2 and the second fixed capacitor C2 may be used to perform an impedance tuning on the receiving coil L. For example, the capacitance value of the second diode D2 may be changed by adjusting an electrical signal input to the two ends of the second diode D2, so as to perform the impedance tuning on the receiving coil L. In some embodiments, the first diode D1 and the second diode D2 may be varactor diodes. In some embodiments, the first diode D1 and the second diode D2 may both be varactor diodes with a high-quality factor that exceeds a specific threshold.

As shown in FIG. 2, a first connection interface A may be provided at a first end M of the first fixed capacitor C1, and a second connection interface B may be provided at a second end N of the second fixed capacitor C2. The first connection interface A and the second connection interface B may be used for connecting the receiving coil L in series. In some embodiments, a negative pole of the first diode D1 may be connected to the first end M of the first fixed capacitor C1 (i.e., the end of the first connection interface A), and the positive pole of the first diode D1 may be connected to a second end P of the first fixed capacitor C1. The negative pole of the second diode D2 may be connected to a first end Q of the second fixed capacitor C2, and the positive pole of the second diode D2 may be connected to a second end N of the second fixed capacitor C2 (i.e., the end of the second connection interface B). In some embodiments, connection directions of the first diode D1 and the second diode D2 may be changed, simply by adjusting the direction (positive/negative) of the voltage output to the varactor assembly.

In some embodiments, the tuning device 200 of the receiving coil may further include a third fixed capacitor C3 disposed between the second end P of the first fixed capacitor C1 and the first end Q of the second fixed capacitor C2. In some embodiments, the third fixed capacitor C3 mainly serves as a direct current (DC) blocking capacitor, and may also be used as a frequency tuning capacitor of the receiving coil L.

In some embodiments, the resonant frequency F of the receiving coil L may be calculated according to the following Equation (1):

$$F = \frac{1}{2\pi\sqrt{c_1 l}} \tag{1}$$

where, $c_1$ denotes the capacitance value of the capacitor connected in series to the receiving coil L, and l denotes the inductance value of the receiving coil L. According to Equation (1), for a constant inductance value l, the resonant frequency may be inversely proportional to the capacitance value $c_1$, and the tuning of the resonant frequency may be achieved by changing the magnitude of the capacitance value of the capacitor connected in series to the receiving coil L.

In some embodiments, when the first diode D1 is connected in parallel to both ends of the first fixed capacitor C1, the first diode D1 and the first fixed capacitor C1 may form a first equivalent capacitance connected in series to the receiving coil L, and the capacitance value of the first equivalent capacitance may be $c_1$. By changing the magnitude of the electrical signal input to the first diode D1, the capacitance value $c_1$ of the first equivalent capacitance may be changed, thereby achieving the frequency tuning of the receiving coil L.

In some embodiments, an output impedance of the receiving coil L may be calculated according to the following Equation (2):

$$Xc = \frac{1}{\omega c_2} \qquad (2)$$

where, $c_2$ denotes the capacitance value of the capacitor connected in parallel to the receiving coil L, and c) denotes an angular frequency of a current flowing through the receiving coil L. According to Equation (2), the output impedance of the receiving coil L may be inversely proportional to the capacitance value $c_2$, and the output impedance of the receiving coil L may be changed by changing the magnitude of the capacitance value $c_2$ of the capacitor connected in parallel with the receiving coil L, so as to make the output impedance of the receiving coil L and an internal impedance of a signal source match each other, i.e., perform an impedance matching process, thereby achieving the impedance tuning.

In some embodiments, when the second diode D2 is connected in parallel to both ends of the second fixed capacitor C2, the second diode D2 and the second fixed capacitor C2 may form a second equivalent capacitance connected in parallel with the receiving coil L, and the capacitance value of the second equivalent capacitance may be $c_2$. By changing the magnitude of the electrical signal input to the second varactor assembly D1, the capacitance value $c_2$ of the second equivalent capacitor may be implemented, thereby achieving the impedance tuning of the receiving coil L.

In some embodiments, the impedance tuning and frequency tuning of the receiving coil L may be achieved by connecting the first diode D1 in parallel to both ends of the first fixed capacitor C1 for determining the resonant frequency of the receiving coil L and connecting the second diode D2 in parallel to both ends of the second fixed capacitor C2 for determining the impedance matching of the receiving coil L. Specifically, the first diode D1 and the first fixed capacitor C1 may be equated to the first equivalent capacitance, and the second diode D2 and the second fixed capacitor C2 may be equated to the second equivalent capacitance. By outputting the voltages to the two ends of the first diode D1 and the two ends of the second diode D2, and changing the magnitudes of the voltages, the capacitance values of the first diode D1 and the second diode D2 may be changed, thereby changing the capacitance values of the first equivalent capacitance and the second equivalent capacitance. As a result, the impedance tuning and the frequency tuning of the receiving coil L may be achieved under the condition of ensuring the quality factor of the cryogenic probe. The first diode D1 and the second diode D2 may be varactor diodes with high-quality factors.

When the receiving coil L, the first diode D1, the second diode D2, the first fixed capacitor C1, and the second fixed capacitor C2 are placed in a special environment, such as a cryogenic vacuum cavity, a user may perform the frequency tuning and/or the impedance tuning on the receiving coil L by changing the magnitude of the voltages applied to the first diode D1 and the second diode D2. For example, the user may remotely control the magnitude of the voltage output to the ends of the first diode D1 and the second diode D2 using a user terminal. Or, a computing device may automatically adjust the magnitude of the voltages applied to the ends of the first diode D1 and the second diode D2, thereby achieving the automated frequency tuning and/or the impedance tuning. According to the embodiments of the present disclosure, the difficulty in the frequency tuning and/or the impedance tuning for the receiving coil in special environments (e.g., the cryogenic probes) may be solved.

FIG. 3 is a circuit diagram illustrating a tuning device 300 for a receiving coil according to some embodiments of the present disclosure. The tuning device 300 may be similar to the tuning device 200, with the difference that the tuning device 300 may also include a power supply. The power supply may be used to output a voltage to a varactor assembly, and a control assembly may control the magnitude of the voltage output from the power supply to adjust a capacitance value of the varactor assembly to a target capacitance value. The target capacitance value may be the capacitance value to which the varactor assembly needs to be adjusted when a frequency tuning or an impedance tuning is performed, which may be determined according to Equation (1) and Equation (2).

As shown in FIG. 3, the power supply may include a first power supply DC1 and a second power supply DC2. A negative pole of the first power supply DC1 may be connected to a positive pole of the first diode D1 (i.e., the second end P of the first fixed capacitor C1), a positive pole of the first power supply DC1 may be connected to the ground end GND and the first end M (i.e., the end of the first connection interface A) of the first fixed capacitor C1, respectively. A negative pole of the second power supply DC2 may be connected to the positive pole of the second diode D2 (i.e., the second end N of the second fixed capacitor C2), and the positive pole of the second power supply DC2 may be connected to the ground end GND and the first terminal M (i.e., one end of the first connection interface A) of the first fixed capacitor C1, respectively. In some embodiments, the first power supply DC1 and the second power supply DC2 may be used to output current signals to control the varactor assembly. Merely by way of example, both the first power supply DC1 and the second power supply DC2 may output DC signals.

In some embodiments, when the first power supply DC1 outputs a positive voltage, the first diode D1 and the first fixed capacitor C1 may be equated to a first equivalent capacitance. By changing the magnitude of the positive voltage output from the first power supply DC1, the magnitude of the capacitance value of the first diode D1 in a cut-off state may be changed, thereby changing the capacitance value of the first equivalent capacitance, and achieving the frequency tuning of the receiving coil L.

In some embodiments, when the second power supply DC2 outputs the positive voltage, the second diode D2 and the second fixed capacitor C2 may also be equated to a second equivalent capacitance. By changing the magnitude of the positive voltage output from the second power supply DC2, the magnitude of the capacitance value of the second diode D2 in the cutoff state may be changed, thereby changing the capacitance value of the second equivalent capacitance to achieve the impedance tuning of the receiving coil L.

In some embodiments, connection directions of the first diode D1 and the second diode D2 may also be changed by simply adjusting a direction of the voltage output to the varactor assembly. Merely by way of example, the positive pole of the first diode D1 may be connected to the first end M (i.e., one end of the first connection interface A) of the first fixed capacitor C1, and the negative pole of the first diode D1 may be connected to the second end P of the first fixed capacitor C1. The positive pole of the second diode D2 may be connected to the first end Q of the second fixed capacitor C2, and the negative pole of the second diode D2 may be connected to the second end N (i.e., the end of the second connection interface B) of the second fixed capacitor C2. At this time, the negative pole of the first power supply DC1 may be connected to the negative pole of the first diode D1 (i.e., the second end P of the first fixed capacitor C1), the positive pole of the first power supply DC1 may be connected to the ground end GND and the first end M of the first fixed capacitor C1, respectively; the negative pole of the second power supply DC2 may be connected to the negative pole of the second diode D2 (i.e., the second end N of the second fixed capacitor C2), and the positive pole of the second power supply DC2 may be connected to the ground end GND and the first terminal M of the first fixed capacitor C1, respectively. When the first power supply DC1 outputs a negative voltage, the first diode D1 and the first fixed capacitor C1 may be equated to the first equivalent capacitance, and by changing the magnitude of the negative voltage output from the first power supply DC1, the capacitance value of the first diode D1 may be changed, thereby changing the capacitance value of the first equivalent capacitance, and achieving the frequency tuning of the receiving coil L. When the second power supply DC2 outputs the negative voltage, the second diode D2 and the second fixed capacitor C2 may also be equivalent to the second equivalent capacitance, and the capacitance value of the second diode D2 may be changed by changing the magnitude of the negative voltage output by the second power supply DC2, thereby changing the capacitance value of the second equivalent capacitance, and achieving the impedance tuning of the receiving coil L.

FIG. 4 is a circuit diagram illustrating a tuning device 400 for a receiving coil according to some embodiments of the present disclosure. The tuning device 400 may be similar to the tuning device 300, with the difference that the tuning device 400 further includes a control assembly 410, and that a position of the third fixed capacitor C3 in the tuning device 400 may be different from its position in the tuning device 300.

As shown in FIG. 4, the tuning device 400 of the receiving coil may include a first fixed capacitor C1, a second fixed capacitor C2, a third fixed capacitor C3, a first diode D1, a second diode D2, a first power supply DC1, a second power supply DC2, and the control assembly 410. The first diode D1 may be connected in parallel to both ends of the first fixed capacitor C1, and the second diode D2 may be connected in parallel to both ends of the second fixed capacitor C2. The first diode D1 and the second diode D2 may be varactor diodes. The first end M of the first fixed capacitor C1 may be connected to a second end of the third fixed capacitor C3, a first end of the third fixed capacitor C3 may be provided with the first connection interface A, the second end P of the first fixed capacitor C1 may be connected to the first end Q of the second fixed capacitor C2, and the second end N of the second fixed capacitor C2 may be provided with the second connection interface B. The first connection interface A and the second connection interface B may be used for connecting in series to an external receiving coil L. The first power supply DC1 may be connected in parallel to both ends of the first diode D1, and the second power supply DC2 may be connected in parallel to both ends of the second diode D2. Both the first power supply DC1 and the second power supply DC2 may be connected to the control assembly 410. The control assembly 410 may conduct or cut off the first diode D1 by controlling a voltage signal (or may be referred to as a current signal) output from the first power supply DC1, and may conduct or cut off the second diode D2 by controlling the voltage signal output from the second power supply DC2.

In some embodiments, the third fixed capacitor C3 may be provided between the first connection interface A and the first end M of the first fixed capacitor C1, or between the second end P of the first fixed capacitor C1 and the first end Q of the second fixed capacitor C2. The third fixed capacitor C3 may function as a DC blocking capacitor or may be used as a frequency tuning capacitor of the receiving coil L. The third fixed capacitor C3 may prevent the voltage signal output from a positive pole of the first power supply DC1 from directly passing through the receiving coil L and being transmitted to the second diode D2, wherein the voltage signal output from the positive pole of the first power supply DC1 directly passing through the receiving coil L and being transmitted to the second diode D2 may cause the voltage signal output from the positive pole of the first power supply DC1 to disturb conduction or cutoff of the second diode D2.

In some embodiments, the control assembly 410 may be configured to change the voltage signals output from the first power supply DC1 and the second power supply DC2, and thus to control the conduction or cutoff of the first diode D1 and the second diode D2. When the first diode D1 and the second diode D2 are conducting, the receiving coil L may be in a detuned state. When the first diode D1 and the second diode D2 are inversely cutoff, the receiving coil L may be in a tuned state. For example, when the control assembly 410 controls the first power supply DC1 and the second power supply DC2 to output negative voltage signals, the first diode D1 and the second diode D2 conduct, the first fixed capacitor C1 and the second fixed capacitor C2 are short-circuited, causing the resonant frequency of the receiving coil L to change substantially to the low-frequency direction, at which time the receiving coil L enters a detuned state. As another example, when the control assembly 410 controls the first power supply DC1 and the second power supply DC2 to output positive voltage signals, the first diode D1 and the second diode D2 may be inversely cut off, and the receiving coil L may enter the tuning state.

When the receiving coil L is in the tuned state, the first diode D1 and the first fixed capacitor C1 may be equated to a first equivalent capacitance, and the second diode D2 and the second fixed capacitor C2 may be equated to a second equivalent capacitance. By changing magnitudes of the voltage signals output from the first power supply DC1 and the second power supply DC2, capacitance values of the first equivalent capacitance and the second equivalent capacitance may be changed, thereby achieving the impedance tuning and/or the frequency tuning of the receiving coil L. For example, a first target equivalent capacitance value of the first equivalent capacitance including the first diode D1 and the first fixed capacitor C1 required to achieve the frequency tuning may be determined according to Equation (1). The control assembly 410 may control the magnitude of the positive voltage signal output from the first power supply DC1 to adjust the capacitance value of the first equivalent capacitance to the first target equivalent capacitance value, thereby achieving the frequency tuning of the receiving coil L. As another example, a second target equivalent capacitance value of the second equivalent capacitance including the second diode D2 and the second fixed capacitor C2 required to achieve the impedance tuning may be determined according to Equation (2). The control assembly 410 may control the magnitude of the positive voltage signal output by the second power supply DC2 to adjust the capacitance value of the second equivalent capacitance to the second target equivalent capacitance value, thereby achieving the impedance tuning of the receiving coil L.

In some embodiments, the control assembly 410 may include a processor, a micro controller unit (MCU) or a microcontroller, etc., or any combination thereof.

In the embodiments of the present disclosure, by multiplexing the detuned circuit with the tuned circuit, and changing the voltage signal output by the first power supply and the second power supply through the control assembly 410, the switching of the detuned or tuned state of the receiving coil L may be achieved, so as to further achieving the switching of the detuned circuit and the tuned circuit. According to the embodiments of the present disclosure, the problem that the circuit of the receiving coil L occupies a large space in the conventional technology may be solved. For example, the tuning device 400 in the embodiments of the present disclosure may be used in a cryogenic probe, thereby reducing the space occupied by the circuitry of the receiving coil L in the cryogenic probe, and improving the reliability of the cryogenic probe.

FIG. 5 is a circuit diagram illustrating a tuning device 500 for a receiving coil according to some embodiments of the present disclosure. The tuning device 500 may be similar to the tuning device 300, with a difference that the tuning device 500 may further include a first coaxial cable 10 and a second coaxial cable 20. The first power supply DC1 may be connected to the first diode D1 through the first coaxial cable 10, and the second power supply DC2 may be connected to the second diode D2 through the second coaxial cable 20. The first coaxial cable 10 may include a first inner core and a first outer conductor, and the second coaxial cable 20 may include a second inner core and a second outer conductor.

In some embodiments, as shown in FIG. 5, a positive pole of the first power supply DC1 may be connected to a negative pole of the first diode D1 through the first inner core of the first coaxial cable 10, and a negative pole of the first power supply DC1 may be connected to a positive pole of the first diode D1 through the first outer conductor of the first coaxial cable 10.

In some embodiments, a positive pole of the second power supply DC2 may be connected to a negative pole of the second diode D2 through the second inner core of the second coaxial cable 20, and a negative pole of the second power supply DC2 may be connected to a second positive pole of the diode D2 through the second outer conductor of the second coaxial cable 20.

In some embodiments, the first diode D1 and the second diode D2 may both be disposed in a cryogenic vacuum cavity along with the first fixed capacitor C1 and the second fixed capacitor C2. When the first diode D1 and the second diode D2 are both disposed in the cryogenic vacuum cavity, the first coaxial cable 10 may be mainly used for transmitting a radio-frequency signal (RF) signal received by the receiving coil L. The first coaxial cable 10 may further transmit a current signal output by the first power supply DC1 to control the first diode D1. The second coaxial cable 20 may be mainly used for transmitting the current signal output by the second power supply DC2 to control the second diode D2. A tuning operation may be performed on the receiving coil L by controlling magnitudes of positive voltages output from the first power supply DC1 and the second power supply DC2 through control assembly.

In some embodiments, the first power supply DC1 and the second power supply DC2 may be placed in a room temperature environment. The first coaxial cable 10 and the second coaxial cable 20 may be transitioned from a cold environment to a room temperature environment through a connector to avoid impacts on the signal transmission. In some embodiments, instead of the first coaxial cable 10 and the second coaxial cable 20, a DC cable may also be used for transmitting the current signals output from the first power supply DC1 and the second power supply DC2.

FIG. 6 is a circuit diagram illustrating a tuning device 600 for a receiving coil according to some embodiments of the present disclosure. The tuning device 600 may be similar to the tuning device 400, with a difference that the tuning device 600 may further include the first coaxial cable 10 and the second coaxial cable 20. The first power supply DC1 may be connected to the first diode D1 through the first coaxial cable 10, and the second power supply DC2 may be connected to the second diode D2 through the second coaxial cable 20.

In some embodiments, the first coaxial cable 10 may include a first inner core and a first outer conductor, and the second coaxial cable 20 may include a second inner core and a second outer conductor. In some embodiments, a positive pole of the first power supply DC1 may be connected to a negative pole of the first diode D1 through the first inner core, and a negative pole of the first power supply DC1 may be connected to a positive pole of the first diode D1 through the first outer conductor. In some embodiments, the positive pole of the second power supply DC2 may be connected to the negative pole of the second diode D2 through the second inner core, and the negative pole of the second power supply DC2 may be connected to the positive pole of the second diode D2 through the second outer conductor.

In some embodiments, the first diode D1 and the second diode D2 may both be disposed in a cryogenic vacuum cavity along with the first fixed capacitor C1 and the second fixed capacitor C2. When the first diode D1 and the second diode D2 are both disposed in the cryogenic vacuum cavity, the first coaxial cable 10 may be mainly used for transmitting the RF signal received by the receiving coil L. The first coaxial cable 10 may also transmit the current signal output by the first power supply DC1 to control the first diode D1. The second coaxial cable 20 may be mainly used for transmitting the current signal output by the second power supply DC2 to control the second diode D2. The tuning operation may be performed on the receiving coil L by adjusting the magnitude of the positive voltage signals output from the first power supply DC1 and the second power supply DC2 by the control assembly 410.

In some embodiments, the control assembly 410, the first power supply DC1, and the second power supply DC2 may all be placed in a room temperature environment. The first coaxial cable 10 and the second coaxial cable 20 may be transitioned from a cold environment to a room temperature environment through a connector, thereby avoiding impacts on the signal transmission. In some embodiments, instead of the first coaxial cable 10 and the second coaxial cable 20, a DC cable may also be used for transmitting the current signals output from the first power supply DC1 and the second power supply DC2.

FIG. 7 is a circuit diagram illustrating a tuning device 700 for a receiving coil according to some embodiments of the present disclosure. The tuning device 700 may be similar to the tuning device 500, with a difference that the tuning device 700 may further include a first inductor L1. The first inductor L1 may be connected in parallel between the first end M of the first fixed capacitor C1 and the first end Q of the second fixed capacitor C2. The first inductor L1 may be a trap inductor for blocking an RF signal received by the receiving coil L and for grounding a current signal passing through the second diode D2.

In some embodiments, the first inductor L1 may be an inductor with a high inductance value, e.g., the inductance value of the first inductor L1 may be greater than an inductance threshold. The inductance threshold may be 600-700 nH, such as 680 nH. The first inductor L1 may be equivalent to an open circuit for the RF signal received by the receiving coil L, and may be equivalent to a short circuit for the current signal passing through the second diode D2. Thus, the first inductor L1 may be used to ground the current signal passing through the second diode D2 and prevent the current signal passing through the second diode D2 from interfering with the RF signal received by the receiving coil L. In some embodiments, the second diode D2 may be in a conductive state when the second power supply DC2 outputs a negative voltage signal, and the first inductor L1 may enable the negative voltage signal output from the second power supply DC2 to flow into the ground end through the first inductor L1.

FIG. 8 is a circuit diagram illustrating a tuning device 800 for a receiving coil according to some embodiments of the present disclosure. The tuning device 800 may be similar to the tuning device 700, with a difference that the tuning device 800 may further include a parallel resonance circuit, a third power supply DC3, and a fifth capacitor C5.

The parallel resonance circuit may be connected in parallel to the receiving coil L to control the receiving coil L to be in a detuned state or a tuned state. In some embodiments, the parallel resonance circuit may include a second inductor L2, a fourth capacitor C4, and a third diode D3. The second inductor L2 and the third diode D3 may be connected in series to form a series circuit, which is connected in parallel to both ends of the fourth capacitor C4. In some embodiments, the third diode D3 may be a varactor diode similar to the first diode D1 and the second diode D2.

As shown in FIG. 8, the fourth capacitor C4 may be connected in series between the first connection interface A and the first end M of the first fixed capacitor C1, the third diode D3 and the second inductor L2 may be connected in series to form a series resistor, and the series resistor formed by the third diode D3 and the second inductor L2 may be connected in parallel to the two ends of the fourth capacitor C4.

In some embodiments, an on-off state of the third diode D3 may be adjusted by adjusting an electrical signal applied to both ends of the third diode D3.

In some embodiments, the parallel resonance circuit may be equivalent as an open circuit when the electrical signal applied to both ends of the third diode D3 makes the third diode D3 conduct. At this time, the receiving coil L may be in a detuned state, and the tuning device 800 may be unable to perform a frequency tuning and/or an impedance tuning on the receiving coil L. When the electrical signal applied to the ends of the third diode D3 cuts off the third diode D3, the second inductor L2 in the parallel resonance circuit may not function, and the fourth capacitor C4 may become a portion of the tuning circuit of the receiving coil L. At this time, the receiving coil L may be in a tuned state, and the tuning device 800 may perform the frequency tuning and/or the impedance tuning on the receiving coil L.

In some embodiments, a third power supply DC3 may be connected in parallel to both ends of the fourth capacitor C4 and may be used to control the conduction and cutoff of the third diode D3. As shown in FIG. 8, a negative pole of the third diode D3 may be connected to a first terminal R of the fourth capacitor C4, a positive pole of the third diode D3 may be connected to the second inductor L2, a positive pole of the third power supply DC3 may be connected to the fourth capacitor C4 at the first end R, and a negative pole of the third power supply DC3 may be connected to a ground end and a second end S of the fourth capacitor C4, respectively. In some embodiments, the first power supply DC1, the second power supply DC2, and the third power supply DC3 may all be DC output power sources.

In some embodiments, the third diode D3 may be conducted when the third power supply DC3 outputs a negative voltage, and the tuning device 800 may be unable to perform the frequency tuning and/or the impedance tuning on the receiving coil L. In some embodiments, when the third power supply DC3 outputs a negative voltage, the third diode D3 may be reversely cutoff, and the tuning device of the receiving coil may perform the frequency tuning and/or the impedance tuning on the receiving coil L.

The fifth capacitor C5 may be connected in series between the fourth capacitor C4 and the first connection interface A. In some embodiments, the fifth capacitor C5 may be used as DC blocking capacitor or may be used as a frequency tuning capacitor for the receiving coil L. The fifth capacitor C5 may prevent the voltage signal output from the third power supply DC3 from being transmitted to the second diode D2 through the receiving coil L, wherein the voltage signal output from the third power supply DC3 being transmitted to the second diode D2 through the receiving coil L may cause the voltage signal output from the third power supply DC3 to interfere the conduction or cutoff of the second diode D2, which affects the frequency tuning and/or the impedance tuning of the receiving coil L.

FIG. 9 is a circuit diagram illustrating a tuning device 900 for a receiving coil according to some embodiments of the present disclosure.

The tuning device 900 may include a control assembly, a varactor assembly, and a fixed capacitor C. As shown in FIG. 9, the fixed capacitor C may include a first fixed capacitor C1 for a frequency tuning and a second fixed capacitor C2 for an impedance tuning. The varactor assembly may include a first adjustable capacitor Ctune1 for the frequency tuning and a second adjustable capacitor Ctune2 for the impedance tuning. The control assembly may include a first control assembly 901 for the frequency tuning and a second control assembly 902 for the impedance tuning. The first fixed capacitor C1 may be connected in series to the receiving coil L, and the first adjustable capacitor Ctune1 may be connected in parallel to both ends of the first fixed capacitor C1. The second fixed capacitor C2 may be connected in series to the receiving coil L, and the second adjustable capacitor Ctune2 may be connected in parallel to both ends of the second fixed capacitor C2.

In some embodiments, the first adjustable capacitor Ctune1 and the second adjustable capacitor Ctune2 may include adjustable components, such as adjustable knobs, buttons, etc. The first control assembly 901 may include a first connecting member, which is used to adjust a capacitance value of the first adjustable capacitor Ctune1. For example, the first control assembly 901 may be used to link the adjustable knob of the first adjustable capacitor Ctune1 through the first connecting member to adjust the capacitance value of the first adjustable capacitor Ctune1 to achieve the frequency tuning for the receiving coil L. The second control assembly 902 may include a second connecting member, which is used to adjust the capacitance value of the second adjustable capacitor Ctune2. For example, the second control assembly 902 may be used to link the adjustable knob of the second adjustable capacitor Ctune2 through the second connecting member to adjust the capacitance value of the second adjustable capacitor Ctune2, so as to achieve the impedance tuning for the receiving coil L.

In some embodiments, as shown in FIG. 9, the first control assembly 901 may further include the first power supply DC1, a first driving motor 911 electrically connected to the first power supply DC1, and a first connecting member 912 linked to the first driving motor 911. The first connecting member 912 may be connected to the adjustable knob of the first adjustable capacitor Ctune1, and a rotation of the first connecting member 912 may effectively drive the adjustable knob of the first adjustable capacitor Ctune1 to rotate, so that the capacitance value of the first adjustable capacitor Ctune1 may be adjusted through the adjustable knob to achieve the frequency tuning. In some embodiments, the first connecting member 912 may include a first mechanical screw.

In some embodiments, a stepping direction of the first driving motor 911 may be adjusted by adjusting a direction of the output voltage of the first power supply DC1, driving the first connecting member 912 to move in different directions, thereby driving the adjustable knob of the first adjustable capacitor Ctune1 to rotate in different directions (clockwise or counterclockwise rotation). By adjusting a magnitude of the output voltage of the first power supply DC1, a stepping length of the first driving motor 911 may be adjusted, which drives the first connecting member 912 to move for different distances, thus driving a rotation angle of the adjustable knob of the first adjustable capacitor Ctune1. In this way, the capacitance value of the first adjustable capacitor Ctune1 may be adjusted, thereby changing the capacitance value connected in series to the receiving coil L to achieve the frequency tuning.

In some embodiments, as shown in FIG. 9, the second control assembly 902 may include the second power supply DC2, a second driving motor 921 electrically connected to the second power supply DC2, and a second connecting member 922 connected to the second driving motor 921. The second connecting member 922 may be connected to the adjustable knob of the second adjustable capacitor Ctune1, and the rotation of the second connecting member 922 may effectively drive the adjustment knob of the second adjustable capacitor Ctune1 to rotate, thereby adjusting the capacitance value of the first adjustable capacitor Ctune1 through the adjustable knob to achieve the impedance tuning. In some embodiments, the second connecting member 922 may include a second mechanical screw.

In some embodiments, the stepping direction of the second driving motor 921 may be adjusted by adjusting a direction of the output voltage of the second power supply DC2, driving the second connecting member 922 to move in different directions, and thus driving the adjustable knob of the second adjustable capacitor Ctune2 to rotate in different directions (clockwise or counterclockwise rotation). By adjusting the magnitude of the output voltage of the first power supply DC1, the stepping length of the second driving motor 921 may be adjusted to drive the second connecting member 922 to move for different distances, thereby driving the rotation angle of the adjustable knob of the second adjustable capacitor Ctune2. In this way, the capacitance value of the second adjustable capacitor Ctune2 may be adjusted, thereby changing the capacitance value connected in series to the receiving coil L to achieve the impedance tuning.

In some embodiments, the first adjustable capacitor Ctune1 may be directly connected in parallel to the two ends of the first fixed capacitor C1, and the second adjustable capacitor Ctune2 may be directly connected in parallel to the two ends of the second fixed capacitor C2. In this way, a noise introduced when the capacitor is adjusted may be reduced. Moreover, by utilizing the first control assembly 901 for the adjustment of the first adjustable capacitor Ctune1 and by utilizing the second control assembly 902 for the adjustment of the second adjustable capacitor Ctune2, efficiencies of frequency tuning and impedance tuning may be improved, and a breadth of application scenarios in which the tuning device 900 is used is improved.

In some embodiments, when the tuning device 900 is in a special environment, such as in a vacuum-tight chamber or in an environment that requires a high degree of hermeticity, the adjustable capacitor and the control assembly may be placed in the vacuum-tight chamber, and merely by performing a parameter adjustment on the control assembly, the capacitance value of the adjustable capacitor can be adjusted, thereby avoiding an impact of manual adjustment or mechanical adjustment on the hermeticity.

In some embodiments, the first driving motor 911 and the second driving motor 921 may be non-magnetic motors which may effectively avoid an interference on the receiving coil and a scanning, and ensure a scanning effect.

In some embodiments, the varactor assembly may also include a capacitance circuit consisting of a plurality of adjustable capacitors connected in parallel or in series, and may not be limited to a single adjustable capacitor, as long as a capacitance value is adjustable in response to an external force.

In some embodiments, the varactor assembly and the fixed capacitor C may also be connected in series, as long as the overall capacitance of the circuit can be changed by adjusting the capacitance value of the varactor assembly during the frequency tuning process or the impedance tuning process.

FIG. 10 is a flowchart illustrating an exemplary process for tuning a receiving coil according to some embodiments of the present disclosure.

In some embodiments, a process 1000 may be performed by the tuning device 900 described in FIG. 9. For example, the process 1000 may be implemented as an instruction set (e.g., an application program) stored in a memory, and control assembly of the tuning device may perform the instruction set and be configured to perform the process 1000 when the instruction set is performed. The schematic diagram of the operations of process 1000 presented below is illustrative. In some embodiments, the process may be accomplished by utilizing one or more additional operations that are not described and/or by omitting one or more operations discussed below. Additionally, the order of the operations of process 1000 illustrated in FIG. 10 and described below is not intended to be limiting.

Operation S1, a capacitance value of varactor assembly may be initialized.

As shown in FIG. 9, the varactor assembly may include the first adjustable capacitor Ctune1 and the second adjustable capacitor Ctune2. The control assembly may include the first control assembly 901 and the second control assembly 902. In some embodiments, the first control assembly

901 may be used to adjust a first capacitance value of the first adjustable capacitor Ctune1 to a first initial capacitance value, and the second control assembly 902 may be used to adjust a second capacitance value of the second adjustable capacitor Ctune2 to a second initial capacitance value. In some embodiments, the first initial capacitance value and the second initial capacitance value may be the same or different. In some embodiments, the first initial capacitance value and/or the second initial capacitance value may be in a range of 10 pF-30 pF. In some embodiments, the first initial capacitance value and/or the second initial capacitance value may be set empirically or may be determined based on the parameters of the components in the tuning device 900.

Operation S2, a frequency tuning and/or an impedance tuning may be performed for the receiving coil by adjusting the capacitance value of the varactor assembly.

In some embodiments, the first control assembly 901 may include the first connecting member 912. The first control assembly 901 may control the first connecting member 912 to link an adjustable component of the first adjustable capacitor Ctune1, so as to adjust the first capacitance value of the first adjustable capacitor Ctune1, thereby achieving the frequency tuning of the receiving coil. In some embodiments, the first control assembly 901 may adjust the first capacitance value of the first adjustable capacitor Ctune1, so as to make a first reflection coefficient curve corresponding to the first adjustable capacitor Ctune1 satisfy a first preset condition of the frequency tuning. For example, the first preset condition may include that a sweep frequency corresponding to the lowest point of the first reflection coefficient curve is within a preset frequency range. More descriptions regarding the first reflection coefficient curve and the first preset condition can be found in FIG. 11 and the related descriptions thereof, which are not repeated here.

In some embodiments, the second control assembly 902 may include the second connecting member 922. The second control assembly 902 may control the second connecting member 922 to link the adjustable component of the second adjustable capacitor Ctune2 to adjust the second capacitance value of the second adjustable capacitor Ctune2, thereby achieving the impedance tuning of the receiving coil. In some embodiments, the second control assembly 902 may adjust the second capacitance value of the second adjustable capacitor Ctune2 to make a second reflection coefficient curve corresponding to the second adjustable capacitor Ctune2 satisfy a second preset condition of the impedance tuning. For example, the second preset condition may include that the lowest point of the second reflection coefficient curve is less than a first preset value, and that an absolute value of a difference between a matching voltage of the current moment and a matching voltage of the previous moment is less than a second preset value. More descriptions regarding the second reflection coefficient curve and the second preset condition can be found in FIG. 11 and the related descriptions thereof, which are not repeated here.

In some embodiments, operation S2 may be performed according to the tuning process shown in FIG. 11.

Operation S21, adjusting the first capacitance value of the first adjustable capacitor Ctune1 to make the first reflection coefficient curve corresponding to the first adjustable capacitor Ctune1 satisfy the first preset condition of the frequency tuning.

In some embodiments, the first control assembly 901 may update the first capacitance value of the first adjustable capacitor Ctune1 by changing the direction and the magnitude of the first voltage output from the first power supply DC1. The first control assembly 901 may further determine whether the first reflection coefficient curve corresponding to the updated first capacitance value satisfies the first preset condition of the frequency tuning. The first reflection coefficient curve may be a curve including different reflection coefficients generated by the first adjustable capacitor Ctune1 at different frequency sweep frequencies. When the first adjustable capacitor Ctune1 is updated, the corresponding sweep frequencies may change and the corresponding first reflection coefficient curve may be updated correspondingly. Through the first reflection coefficient curve and the first preset condition, whether the frequency tuning of the first adjustable capacitor Ctune1 is successful under the first capacitance value may be determined.

When the first reflection coefficient curve corresponding to the updated first capacitance value does not satisfy the first preset condition of the frequency tuning, the first control assembly 901 may further adjust the direction and the magnitude of the first voltage output from the first power supply DC1 to further update the first capacitance value of the first adjustable capacitor Ctune1 until the first reflection coefficient curve corresponding to the first capacitance value satisfies the first preset condition for the frequency tuning.

When the first reflection coefficient curve corresponding to the updated first capacitance value satisfies the first preset condition for the frequency tuning, the adjustment of the first voltage may be stopped and the following operation S22 may be performed.

In some embodiments, operation S21 may be performed according to a process 1200 shown in FIG. 12.

Operation S211, obtaining a sweep reflection coefficient curve generated after the receiving coil L is swept, the sweep reflection coefficient curve including reflection coefficients of the receiving coil at different sweep frequencies.

In some embodiments, the receiving coil L may be swept using a preset signal source at a preset center frequency and a preset bandwidth, and the reflection coefficients of the receiving coil at different sweep frequencies may be determined. Based on the reflection coefficients at different sweep frequencies, the sweep reflection coefficient curve may be obtained. For example, a horizontal coordinate of the sweep reflection coefficient curve may be the sweep frequency and a vertical coordinate may be the reflection coefficient. The preset center frequency and the preset bandwidth may be arbitrary values. For example, the preset center frequency may be 400.55 MHz and the preset bandwidth may be plus or minus 2.5 MHz. It may be understood that a sweep frequency range may be set by setting the preset center frequency and the preset bandwidth, different application scenarios may have different application requirements for the sweep frequency range, and the preset center frequency and the preset bandwidth may be set as required.

In some embodiments, a reflection coefficient corresponding to a sweep frequency may be obtained by dividing a reflected voltage of the receiving coil L by an incident voltage of the receiving coil L at the sweep frequency. In some embodiments, the sweep reflection coefficient curve may be pre-generated and stored in a memory of the tuning device 900, and the first control assembly 901 may obtain the sweep reflection coefficient curve from the memory.

For example, FIG. 13 is a schematic diagram illustrating a sweep circuit according to some embodiments of the present disclosure. As shown in FIG. 13, when the receiving coil L is in a transmitting state, the signal source may be connected to the receiving coil L in a straight-through connection. The preset center frequency may be set to 400.55 MHz, the preset bandwidth may be plus or minus 2.5 MHz, and the preset center frequency and preset bandwidth may form the sweep frequency range. By using the sweep circuit to sweep the receiving coil in the sweep frequency range, the sweep reflection coefficient curve as shown in FIG. 14 may be generated. The horizontal coordinate of the sweep reflection coefficient curve as shown in FIG. 14 may be the sweep frequency in MHz, and the vertical coordinate may be the reflection coefficient.

Operation S212, the first capacitance value may be updated by adjusting the first voltage.

The first control assembly 901 may adjust the first capacitance value of the first adjustable capacitor Ctune1 by adjusting the direction and the magnitude of the first voltage output from the first power supply DC1. Specifically, the stepping direction of the first driving motor 911 may be adjusted by adjusting the direction of the first voltage to drive the first connecting member 912 to move in different directions, thereby driving the adjustable knob of the first adjustable capacitor Ctune1 to rotate in different directions (clockwise or counterclockwise rotation). The stepping length of the first driving motor 911 in the first control assembly 901 may be adjusted by adjusting the magnitude of the first voltage, so as to drive the first connecting member 912 to move for different distances, thereby changing a rotation angle of the adjustable knob of the first adjustable capacitor Ctune1. In such cases, the capacitance value of the first adjustable capacitor Ctune1 may be adjusted.

Operation S213, the sweep reflection coefficient curve may be updated based on the updated first capacitance value, and the first reflection coefficient curve corresponding to the updated first capacitance value may be generated.

In some embodiments, as a change in the first capacitance value affects a change in the sweep reflection coefficient curve in the horizontal coordinate, the first control assembly 901 may update the sweep reflection coefficient curve based on the updated first capacitance value. The updated sweep reflection coefficient curve may be the first reflection coefficient curve corresponding to the updated first capacitance value.

In some embodiments, the first control assembly 901 may determine a corresponding resonant frequency based on the updated first capacitance value and the inductance value of the receiving coil L. The first control assembly 901 may generate a corresponding first reflection coefficient curve based on the updated sweep reflection coefficient curve. Specifically, the resonant frequency may be determined according to equations:

$$f = 1/2\pi\sqrt{C_s L},$$

where $C_s$=Ctune1+Ctune2, L denotes the inductance value of the receiving coil L. The second capacitance value of the second adjustable capacitor Ctune2 and the inductance value L of the receiving coil L may be constant during the process of frequency tuning. The first capacitance value of the first adjustable capacitor Ctune1 may be updated with a change of the first voltage, and the greater the first voltage, the greater the first capacitance value, and the smaller the corresponding resonant frequency.

It should be noted that the resonant frequency may generally be the frequency corresponding to the lowest point in the reflection coefficient curve (including the sweep reflection coefficient curve, the first reflection coefficient curve, and the second reflection coefficient curve). Adjusting the first capacitance value may result in a change of the resonant frequency, and thus the sweep reflection coefficient curve may change on an axis of the sweep frequency. If the horizontal coordinate is the sweep frequency, the lowest point of the sweep reflection coefficient curve may change on the horizontal coordinate, and the changed and updated sweep reflection coefficient curve may be the first reflection coefficient curve. After the frequency tuning is successful, the corresponding first reflection coefficient curve may satisfy the first preset condition. Further, the vertical coordinate of the sweep reflection coefficient curve may be the reflection coefficient corresponding to the sweep frequency. In the process of changing the second capacitance value for the impedance tuning, the first reflection coefficient curve may change in the longitudinal coordinate, and a corresponding second reflection coefficient curve may be generated. After the impedance tuning is successful, the corresponding second reflection coefficient curve may satisfy the second preset condition.

Operation S214, whether the first reflection coefficient curve satisfies the first preset condition of the frequency tuning may be determined.

In some embodiments, the first preset condition may include that the sweep frequency corresponding to the lowest point of the first reflection coefficient curve is within a preset frequency range. The sweep frequency corresponding to the lowest point of the sweep reflection coefficient curve may be the corresponding resonant frequency, and the change in the resonant frequency may cause a range of the lowest point to change. In some embodiments, the preset frequency range may be set empirically, or the frequency range that satisfies the frequency tuning may be determined based on the parameters of the components in the tuning device 900. For example, the preset frequency range may be in a range of 400.55 MHz+/−500 KHz, i.e., between 400.55 MHz-500 KHz and 400.55 MHz+500 KHz.

When the first reflection coefficient curve does not satisfy the first preset condition, operation S212 may be performed again to adjust the magnitude and/or direction of the first voltage to further update the first capacitance value. For example, a bisection algorithm may be used to update the first voltage. The bisection algorithm refers to an algorithm of continuously selecting an intermediate value within a preset voltage interval and further updating the voltage interval based on the intermediate value, and obtaining an expected first voltage after iterations. By using the bisection algorithm for updating, the first voltage may be efficiently adjusted and a step range may be narrowed so as to quickly determine the first capacitance value that satisfies the first preset condition. In some embodiments, if the sweep frequency corresponding to the lowest point of the first reflection coefficient curve obtained in the current iteration exceeds the preset frequency range, the first voltage may be reduced, otherwise, the first voltage may be increased. In this way, the first voltage may be effectively adjusted according to the sweep frequency corresponding to the lowest point of the first reflection coefficient curve, thereby facilitating the first capacitance value and the sweep frequency to change again until the sweep frequency at the lowest point is located in the preset frequency range.

Operations S212-S214 may be performed for a plurality of times until the first reflection coefficient curve corresponding to the latest updated first capacitance value satisfies the first preset condition.

When the first reflection coefficient curve satisfies the first preset condition, it indicates that the frequency tuning has been achieved, the process 1200 may be finished, and operation S22 may be executed.

Taking FIG. 14 as an example, assuming that the curve in FIG. 14 is the first reflection coefficient curve, the preset frequency range is between 400.55 MHz-500 KHz and 400.55 MHz+500 KHz. If a lowest point of the first reflection coefficient curve lies within the interval, the frequency tuning may be considered to be successful. Otherwise, the first voltage may be updated using the bisection algorithm. If the sweep frequency corresponding to the lowest point of the first reflection coefficient curve is higher than 400.55 MHz+500 KHz, the first control assembly 901 may reduce the first voltage. If the sweep frequency corresponding to the lowest point of the first reflection curve is lower than 400.55 MHz-500 KHz, the first control assembly 901 may increase the first voltage, adjust the first capacitance value again based on the updated first voltage, generate a new resonant frequency, and enter the next iteration until the frequency tuning is successful.

Operation S22, the second capacitance value of the second adjustable capacitor Ctune2 may be adjusted so that the second reflection coefficient curve corresponding to the second adjustable capacitor Ctune2 satisfies the second preset condition of the impedance tuning.

When the frequency tuning is successful, the tuning device 900 may further perform the impedance tuning.

In some embodiments, the second control assembly 902 may update the second capacitance value of the second adjustable capacitor Ctune2 by changing the direction and the magnitude of the second voltage output from the second power supply DC2. The second control assembly 902 may further determine whether the second reflection coefficient curve corresponding to the updated second capacitance value satisfies the second preset condition of the impedance tuning. As a result of the successful frequency tuning, the change of the second capacitance value may result in a change in the impedance, and different impedances may affect the reflection coefficient, resulting in a generation of different reflection coefficients to form the second reflection coefficient curve. When the second capacitance value of the second adjustable capacitor Ctune2 is updated, the corresponding second reflection coefficient curve may be updated correspondingly. Using the second reflection coefficient curve and the second preset condition, it may be possible to efficiently determine whether the impedance tuning of the second adjustable capacitor Ctune2 is successful under the second capacitance value.

When the updated second reflection coefficient curve corresponding to the second capacitance value does not satisfy the second preset condition of the impedance tuning, the second control assembly 902 may further adjust the direction and the magnitude of the second voltage output from the second power supply DC2 to further update the second capacitance value of the second adjustable capacitor Ctune2, until the second reflection coefficient curve corresponding to the second capacitance value satisfies the second preset condition for the impedance tuning.

When the second reflection coefficient curve corresponding to the updated second capacitance value satisfies the second preset condition for the frequency tuning, the tuning device 900 may have successfully performed the frequency tuning.

In some embodiments, operation S22 may be performed according to a process 1500 shown in FIG. 15.

Operation S221, the second capacitance value may be updated by adjusting the second voltage.

The second control assembly 902 may adjust the second capacitance value of the second adjustable capacitor Ctune2 by adjusting the direction and the magnitude of the second voltage output from the second power supply DC2. Specifically, the step direction of the second driving motor 921 may be adjusted by adjusting the direction of the second voltage, so as to drive the second connecting member 922 to move in different directions, thereby driving the adjustable knob of the second adjustable capacitor Ctune2 to rotate in different directions (clockwise or counterclockwise rotation). The step length of the second driving motor 921 may be adjusted by adjusting the size of the second voltage, so as to drive the second connecting member 922 to move for different distances, thereby changing a rotation angle of the adjustable knob of the first adjustable capacitor Ctune2. In such cases, the capacitance value of the second adjustable capacitor Ctune2 may be adjusted.

In some embodiments, operation S221 may be performed according to a process 1600 shown in FIG. 16.

Operation S2211, an initial upper limit voltage, an initial lower limit voltage, and an initial matching voltage may be determined based on a preset upper limit value and a preset lower limit value of the second voltage.

In some embodiments, the second control assembly 902 may determine the preset upper limit value and the preset lower limit value in advance. The preset upper limit value refers to the highest voltage value to be set for the second voltage, and the preset lower limit value refers to the lowest voltage value to be set for the second voltage. The voltage range between the preset upper limit value and the preset lower limit value may be a range in which the second voltage can be adjusted. The second control assembly 902 may determine the preset upper limit value as an initial upper limit voltage, determine the preset lower limit value as an initial lower limit voltage, and determine an intermediate value between the preset upper limit value and the preset lower limit value as an initial matching voltage. In some embodiments, the preset upper limit value and the preset lower limit value may be set empirically, or may be determined based on the parameters of the components in the tuning device of the receiving coil L, or may be determined based on given parameters of a voltage source.

Operation S2212, the initial matching voltage may be updated to generate an updated matching voltage based on an updated second reflection coefficient curve corresponding to each of the initial upper limit voltage, the initial lower limit voltage, and the initial matching voltage.

In some embodiments, the second control assembly 902 may compare the magnitudes of the lowest points in the second reflection coefficient curves corresponding to the initial upper limit voltage, the initial lower limit voltage, and the initial matching voltage, and using the bisection algorithm to update the matching voltage. The lowest point in the second reflection coefficient curve may be a plotted point with the smallest reflection coefficient. In some embodiments, the lowest points of the second reflection coefficient curves corresponding to the initial upper limit voltage, the initial lower limit voltage, and the initial matching voltage may be compared, and based on the comparison result, a minimum value among the three lowest points may be determined, and then the matching voltage may be updated using the bisection algorithm.

Merely by way of example, the minimum value may be denoted as [v, min], where v denotes the corresponding second voltage and min denotes the reflection coefficient at the lowest point. The minimum point of the second reflection coefficient curve corresponding to the initial upper limit voltage may be denoted as [v1, min1], the minimum point of the second reflection coefficient curve corresponding to the initial lower limit voltage may be denoted as [v2, min2], and the minimum point of the second reflection coefficient curve corresponding to the initial matching voltage may be denoted as [v3, min3]. If min1<min2, the initial matching voltage may be determined as the updated upper limit voltage while updating the matching voltage as v=(v1+v3)/ 2. At this point, the updated matching voltage may be the matching voltage at the current moment, and the initial matching voltage may be the matching voltage at the previous moment. Further comparisons may be made to iteratively update the matching voltage based on the updated upper limit voltage, the initial lower limit voltage, and the updated matching voltage. If min1>min2, then the initial matching voltage may be determined as the updated lower voltage while updating the matching voltage as v=(v2+v3)/ 2. At this point, the updated matching voltage may be the matching voltage at the current moment, and the initial matching voltage may be the matching voltage at the previous moment. Further comparisons may be made to iteratively update the matching voltage based on the initial upper limit voltage, the updated lower limit voltage, and the updated matching voltage.

In some embodiments, updating the matching voltage using the bisection algorithm may effectively and continuously narrow a search range while avoiding missing an optimal point that satisfies the second preset condition, which enhances the efficiency of the search and at the same time saves regulation time.

Operation S2213, the second voltage may be adjusted to update the second capacitance value.

In some embodiments, the second control assembly 902 may take the updated matching voltage as the second voltage to control the second power supply DC2 to output the updated matching voltage, thereby adjusting the capacitance value of the second adjustable capacitor Ctune2.

For the updated second capacitance value, the following operation S222 may be performed to generate a corresponding second reflection coefficient curve.

Operation S222, the reflection coefficients of the plotted points in the first reflection coefficient curve satisfying the first preset condition may be updated based on the updated second capacitance value to generate the corresponding second reflection coefficient curve.

In some embodiments, as the change of the second capacitance value affects the change of the sweep reflection curve in the vertical coordinate, the second control assembly 901 may update the first reflection coefficient curve based on the updated second capacitance value. The updated first reflection coefficient curve may be the second reflection coefficient curve. In some embodiments, a processing device may update the reflection coefficients of the plotted points in the first reflection coefficient curve based on the updated second capacitance value to generate the second reflection coefficient curve corresponding to the updated second capacitance value.

In some embodiments, the second control assembly 902 may determine a corresponding output impedance based on the updated second capacitance value and the inductance value of the receiving coil L. The second control assembly 902 may update the reflection coefficients of the first reflection coefficient curve based on the reflection coefficients corresponding to different output impedances, thereby generating the corresponding second reflection coefficient curve. The manner of determining the reflection coefficients is described above, which is not repeated herein.

Specifically, an equation for calculating the output impedance may be: $X_C=1/\omega C_s$, where $\omega$ denotes an angular frequency when the frequency tuning is successful, and $C_s$=Ctune1+Ctune2. In the process of the impedance tuning, the first capacitance value of the first adjustable capacitor Ctune1 and the inductance value L of the receiving coil may remain constant. The second capacitance value of the second adjustable capacitor Ctune2 may begin to be updated with the change of the second voltage, the greater the second voltage, the greater the second capacitance value, and the smaller the corresponding output impedance.

It should be noted that the second reflection coefficient curve may still take the sweep frequency and the reflection coefficient as the horizontal and vertical coordinates. When the sweep frequency is the horizontal coordinate and the reflection coefficient is the vertical coordinate, in the process of determining the first reflection coefficient curve, the change of the first capacitance value may affect the change of the sweep reflection coefficient curve on the horizontal coordinate, i.e., the changing trend along the vertical coordinate may remain unchanged, and the horizontal coordinate may shift left and right. When the frequency tuning is finished, the corresponding first reflection coefficient curve may be constant, and when the second voltage is adjusted, the change of the capacitance value of the second fixed capacitor Ctune2 (the second capacitance value) may only affect the change of the vertical coordinate of each of the plotted points of the fixed first reflection coefficient curve, i.e., the change of the reflection coefficient. That is to say, the second reflection coefficient curve may be obtained by changing the vertical coordinate of each plotted point based on the fixed first reflection coefficient curve.

Operation S223, whether the second reflection coefficient curve satisfies the second preset condition of the impedance tuning may be determined.

In some embodiments, the second control assembly 902 may determine whether the second reflection coefficient curve corresponding to the second capacitance value updated based on the updated matching voltage satisfies the second preset condition of the impedance tuning. In some embodiments, the second preset condition may include: a minimum point of the second reflection coefficient curve corresponding to the matching voltage at the current moment being less than the first preset value, and an absolute value of a difference between the matching voltage at the current moment and the matching voltage at the previous moment being less than the second preset value. The horizontal coordinate of the second reflection coefficient curve may be the sweep frequency, the vertical coordinate may be the reflection coefficient, and the lowest point of the second reflection coefficient curve may be the lowest point in the vertical coordinate. The lowest point of the second reflection coefficient curve corresponding to the matching voltage at the current moment being less than the first preset value refers to that the lowest reflection coefficient in the second reflection coefficient curve corresponding to the matching voltage at the current moment may be less than the first preset value.

In some embodiments, the first preset value may be set empirically, or based on a range when the impedance tuning is satisfied (which may be determined based on the parameters of the components in the tuning device 900 of the receiving coil). By setting the second preset condition, it may be possible to effectively determine whether the impedance tuning is successful based on the lowest point of the second reflection coefficient curve and the current matching voltage. When the second reflection coefficient curve corresponding to the second capacitance value satisfies the second preset condition of the impedance tuning, it may indicate that the impedance tuning is successful.

In some embodiments, the first preset value may be set in a range between 0.2 and 0.35, for example, the first preset value may be 0.3. By setting the first preset value, whether the reflection coefficient at the lowest point satisfies the corresponding condition may be determined. The specific setting of the first preset value may depend on different application scenarios and is not limited herein.

In some embodiments, the second preset value may be set as a step value of the second voltage, i.e., the absolute value of the difference between the matching voltage at the current moment and the matching voltage at the previous moment may be less than a corresponding step value. The second preset value may be set in a range of 0.1-0.2. By setting the second preset value, the value of the matching voltage may be adjusted more accurately so as to obtain a desired second voltage for the impedance tuning.

When the second reflection coefficient curve does not satisfy the second preset condition, operation 221 may be performed again to adjust the magnitude and/or the direction of the second voltage to further update the second capacitance value. For example, the second voltage may be further updated using the bisection algorithm. By using the bisection algorithm for updating, the step of the second voltage may be efficiently adjusted and the range of the step may be narrowed, which may quickly determine a second capacitance value that satisfies the second preset condition. In some embodiments, if the lowest point of the second reflection coefficient curve obtained in the current iteration is greater than or equal to the first preset value, the matching voltage at the current moment may be updated according to the descriptions of operation S2212. In this way, the second voltage may be effectively adjusted based on the matching voltage at the current moment according to the value of its lowest point, thereby prompting the second capacitance value and the corresponding second reflection coefficient curve to change again until the lowest point is less than the first preset value, and making the absolute value of the difference between the matching voltage at the current moment and the matching voltage at the previous moment less than the second preset value.

In some embodiments, the second control assembly 902 may update the reflection coefficients of the plotted points of the first reflection coefficient curve based on the updated second capacitance value to generate the second reflection coefficient curve corresponding to the updated second capacitance value. Further, the second control assembly 902 may determine whether the second reflection coefficient curve and the second voltage satisfy the second preset condition of the impedance tuning.

Operations S221-S223 may be performed for a plurality of times until the second reflection coefficient curve corresponding to the latest updated second capacitance value satisfies the second preset condition. When the second reflection coefficient curve satisfies the second preset condition, it may indicate that the impedance tuning is achieved, and the process 1500 may be finished.

It should be noted that the foregoing descriptions with respect to process 1000, process 1100, process 1200, process 1500, and process 1600 are intended to be exemplary and illustrative only, and do not limit the scope of application of the present disclosure. For those skilled in the art, various corrections and changes may be made to the process 1000, the process 1100, the process 1200, the process 1500, and the process 1600 under the guidance of the present disclosure. However, these corrections and changes remain within the scope of the present disclosure. Process 1000, process 1100, process 1200, process 1500, and process 1600 may be performed by other processing devices. For example, in some embodiments, the processes may be performed by a processor internal or external to the tuning device 900.

Embodiments of the present disclosure also provide a computer-readable storage medium stored with a computer program that, when executed by a processor, implements the method of tuning the receiving coil as described above. The computer-readable storage medium may be, for example, but not limited to, a system, device, or apparatus that is electrical, magnetic, optical, electromagnetic, infrared, or semiconducting, or any combination thereof. More specific examples of the computer-readable storage media (a non-exhaustive list) may include: electrical connections with one or more wires, portable computer disks, hard disks, random access memory (RAM), read-only memories (ROM), erasable programmable read-only memories (EPROMs or flash memories), optical fibers, compact disk read-only memories (CD-ROMs) for portability, optical storage devices, magnetic storage device, or any suitable combination thereof. As used herein, a computer-readable storage medium may be any tangible medium containing or storing a program, that is used by, or in combination with, an instruction-executing system, device, or apparatus.

Embodiments of the present disclosure also provide a computing device including a memory, a processor, and a computer program stored in the memory and runnable on the processor, the processor executing the program to implement the method of tuning the receiving coil as described above.

Embodiments of the present disclosure provide a cryogenic probe including a tuning device for the receiving coil as described above.

In the embodiments of the present disclosure, the cryogenic probe may have a high accuracy but a high requirement for the tightness of a scanning environment, and the frequency tuning and/or the impedance tuning in a sealed cryogenic confinement scenario may be achieved by using the abovementioned tuning device for the coil to ensure a probing accuracy of the cryogenic probe.

Embodiments of the present disclosure provide a magnetic resonance system including a cryogenic probe as described above.

The beneficial effects that may be brought about by the embodiments of the present disclosure may include, but not limited to: (1) adjusting the capacitance value of the circuit by connecting the varactor assembly in parallel to the two ends of the fixed capacitor and controlling the capacitance change of the varactor assembly through the control assembly, thereby achieving an auto-tuning process of frequency tuning and/or the impedance tuning for the receiving coil, which occupies less space and requires fewer components; (2) by connecting the varactor assembly in parallel to the two ends of the fixed capacitor, the capacitance value of the whole circuit can be adjustable, which reduces a use of cables, reduces an introduction of noise, and effectively reduces a loss of the receiving coil; (3) adjusting the capacitance of the varactor assembly by using the control assembly can avoid a tediousness of manual adjustment, and can be suitable for any application scenarios without any limitation of the environment, which ensures a flexibility of the applicable scenarios; (4) driving the capacitance value of the varactor assembly to iteratively update using the control assembly, thus effectively changing the overall capacitance value of the circuit where the receiving coil is located, which not only increases the tuning efficiency, but also avoids environmental limitations, and efficiently adjusts the frequency or impedance until the frequency tuning and/or the impedance tuning are performed successfully; (5) in the magnetic resonance system, a cryogenic probe needs to be utilized to achieve more accurate scanning effects, and the above tuning device for the receiving coil in the cryogenic probe is used to perform the corresponding frequency tuning and/or impedance tuning, which ensures the overall scanning effect of the magnetic resonance system.

It may be noted that different embodiments may generate different beneficial effects, in different embodiments, the beneficial effects generated may be any one or any combination above, or may be any other beneficial effect that is likely to be achieved.

The basic concepts have been described above, and it is apparent to those skilled in the art that the foregoing detailed disclosure is intended as an example only and does not constitute a limitation of the present disclosure. While not expressly stated herein, various modifications, improvements, and amendments may be made to the present disclosure by those skilled in the art. Those types of modifications, improvements, and amendments are suggested in the present disclosure, so those types of modifications, improvements, and amendments remain within the spirit and scope of the exemplary embodiments of the present disclosure.

Also, the present disclosure uses specific words to describe embodiments thereof, such as "an embodiment", "one embodiment", and/or "some embodiments" which means a feature, structure, or characteristic associated with at least one embodiment of the present disclosure. Accordingly, it should be emphasized and noted that the "an embodiment", "one embodiment", or "some embodiments" referred to two or more times in different locations in the present disclosure do not necessarily refer to the same embodiment. In addition, certain features, structures, or characteristics of one or more embodiments of the present disclosure may be suitably combined.

In addition, unless expressly stated in the claims, the order of the processing elements and sequences, the use of numerical letters, or the use of other names as described in the present disclosure are not intended to qualify the order of the processes and methods of the present disclosure. While some embodiments of the invention that are currently considered useful are discussed in the foregoing disclosure by way of various examples, it should be appreciated that such details serve only illustrative purposes, and that additional claims are not limited to the disclosed embodiments. Rather, the claims are intended to cover all amendments and equivalent combinations that are consistent with the substance and scope of the embodiments of the present disclosure. For example, although the implementation of various components described above may be embodied in a hardware device, it may also be implemented as a software only solution, e.g., an installation on an existing server or mobile device.

Similarly, it should be noted that in order to simplify the presentation of the present disclosure, and thereby aiding in the understanding of one or more embodiments of the present disclosure, the foregoing descriptions of embodiments of the present disclosure sometimes combine a variety of features into a single embodiment, accompanying drawings, or descriptions thereof. However, this manner of disclosure does not imply that more features are required for the objects of the present disclosure than are mentioned in the claims. Rather, claimed subject matter may lie in less than all features of a single foregoing disclosed embodiment.

Some embodiments use numbers describing the number of components, attributes, and it should be understood that such numbers used in the description of embodiments are modified in some examples by the modifiers "approximately", "nearly", or "substantially". Unless otherwise noted, the terms "approximately", "nearly", or "substantially" indicates that a ±20% variation in the stated number is allowed. Correspondingly, in some embodiments, the numerical parameters used in the present disclosure and the claims are approximations, which changes depending on the desired characteristics of individual embodiments. In some embodiments, the numerical parameters should consider the specified number of valid digits and employ general place-keeping. While the numerical domains and parameters used to confirm the breadth of their ranges in some embodiments of the present disclosure are approximations, in specific embodiments such values are set to be as precise as practicable.

For each patent, patent application, patent application disclosure, and other material cited in the present disclosure, such as articles, books, manuals, publications, documents, etc., the entire contents of which are hereby incorporated by reference into the present disclosure. Application history documents that are inconsistent with or conflict with the contents of the present disclosure are excluded, as are documents (currently or hereafter appended to the present disclosure) that limit the broadest scope of the claims of the present disclosure. It should be noted that in the event of any inconsistency or conflict between the descriptions, definitions, and/or use of terms in the materials appended to the present disclosure and those set forth herein, the descriptions, definitions and/or use of terms in the present disclosure shall prevail.

Finally, it should be understood that the embodiments described in the present disclosure are only used to illustrate the principles of the embodiments of the present disclosure. Other deformations may also fall within the scope of the present disclosure. As such, alternative configurations of embodiments of the present disclosure may be considered to be consistent with the teachings of the present disclosure as an example, not as a limitation. Correspondingly, the embodiments of the present disclosure are not limited to the embodiments expressly presented and described herein.

What is claimed is:

1. A cryogenic probe, the cryogenic probe including a receiving coil and a tuning device for a receiving coil, the tuning device comprising:

a fixed capacitor, a varactor assembly, and a control assembly; wherein the control assembly is configured to perform a tuning operation on the receiving coil by controlling a capacitance value of the varactor assembly, the tuning operation including at least one of a frequency tuning or an impedance tuning;

the fixed capacitor includes a first fixed capacitor and a second fixed capacitor, and the varactor assembly includes a first varactor assembly and a second varactor assembly;

the first varactor assembly and the first fixed capacitor are configured to achieve a frequency tuning on the receiving coil;

the second varactor assembly and the second fixed capacitor are configured to achieve an impedance tuning on the receiving coil; and the combination of the first varactor assembly and the first fixed capacitor, the combination of the second varactor assembly and the second fixed capacitor, and the receiving coil are connected in series.

2. A magnetic resonance device, including a cryogenic probe, wherein the cryogenic probe includes a receiving coil and a tuning device for the receiving coil, and the tuning device for the receiving coil comprises:

a fixed capacitor, a varactor assembly, and a control assembly; wherein the control assembly is configured to perform a tuning operation on the receiving coil by controlling a capacitance value of the varactor assembly, the tuning operation including at least one of the frequency tuning or the impedance tuning;

the fixed capacitor includes a first fixed capacitor and a second fixed capacitor, and the varactor assembly includes a first varactor assembly and a second varactor assembly;

the first varactor assembly and the first fixed capacitor being configured to achieve a frequency tuning on the receiving coil;

the second varactor assembly and the second fixed capacitor being configured to achieve an impedance tuning on the receiving coil; and the combination of the first varactor assembly and the first fixed capacitor, the combination of the second varactor assembly and the second fixed capacitor, and the receiving coil are connected in series.

3. The cryogenic probe of claim 1, wherein the control assembly includes a power supply for outputting a voltage to the varactor assembly; and the control assembly is configured to adjust the capacitance value of the varactor assembly to a target capacitance value by changing a magnitude of the voltage output from the power supply.

4. The cryogenic probe of claim 1, wherein the control assembly includes a first power supply and a second power supply, the first power supply being connected to the first varactor assembly through a first coaxial cable, and the second power supply being connected to the second varactor assembly through a second coaxial cable.

5. The cryogenic probe of claim 1, wherein the tuning device further includes a first inductor connected in parallel to the first fixed capacitor.

6. The cryogenic probe of claim 1, wherein the device further includes a parallel resonance circuit connected in parallel to the receiving coil, the parallel resonance circuit being configured to control the receiving coil to be in a detuned state or a tuned state.

7. The cryogenic probe of claim 1, wherein the first varactor assembly includes a first adjustable capacitor, the second varactor assembly includes a second adjustable capacitor, the control assembly includes a first control assembly, a second control assembly, a first connecting member, and a second connecting member, wherein the first control assembly is configured to adjust a capacitance value of the first adjustable capacitor by controlling the first connecting member to link an adjustable member of the first adjustable capacitor, so as to perform the frequency tuning on the receiving coil; and the second control assembly is configured to adjust a capacitance value of the second adjustable capacitor by controlling the second connecting member to link an adjustable member of the second adjustable capacitor, so as to perform the impedance tuning on the receiving coil.

8. The cryogenic probe of claim 1, wherein the first varactor assembly includes a first adjustable capacitor, the second varactor assembly includes a second adjustable capacitor, the control assembly includes a first control assembly and a second control assembly, the first control assembly is configured to adjust a first capacitance value of the first adjustable capacitor such that a first reflection coefficient curve corresponding to the first adjustable capacitor satisfies a first preset condition of the frequency tuning; and the second control assembly is configured to adjust a second capacitance value of the second adjustable capacitor such that a second reflection coefficient curve corresponding to the second adjustable capacitor satisfies a second preset condition of the impedance tuning.

9. The cryogenic probe of claim 1, wherein the first varactor assembly is connected in parallel to both ends of the first fixed capacitor, and the second varactor assembly is connected in parallel to both ends of the second fixed capacitor.

10. The cryogenic probe of claim 1, wherein the tuning device further includes a third fixed capacitor, the third fixed capacitor being connected in series between the combination of the first varactor assembly and the first fixed capacitor and the combination of the second varactor assembly and the second fixed capacitor, the third fixed capacitor serves as a direct current (DC) blocking capacitor or a frequency tuning capacitor of the receiving coil.

11. The cryogenic probe of claim 1, wherein the tuning device further includes a third fixed capacitor, the third fixed capacitor being connected in series between the receiving coil and the combination of the first varactor assembly and the first fixed capacitor, the third fixed capacitor serves as a direct current (DC) blocking capacitor or a frequency tuning capacitor of the receiving coil.

12. The cryogenic probe of claim 3, wherein the control assembly is further configured to determine the target capacitance value based on at least one of a resonant frequency of the receiving coil or a target output impedance of the receiving coil.

13. The cryogenic probe of claim 8, wherein the first preset condition includes that a sweep frequency corresponding to a lowest point of the first reflection coefficient curve is within a preset frequency range.

14. The cryogenic probe of claim 8, wherein to adjust a first capacitance value of the first adjustable capacitor such that a first reflection coefficient curve corresponding to the first adjustable capacitor satisfies a first preset condition of the frequency tuning, the first control assembly is configured to:

update the first capacitance value of the first adjustable capacitor by adjusting a first voltage applied to the first adjustable capacitor;

determine whether the first reflection coefficient curve corresponding to the updated first capacitance value satisfies the first preset condition of the frequency tuning;

in response to determining that the first reflection coefficient curve does not satisfy the first preset condition, continue to adjust the first voltage to further update the first capacitance value; or in response to determining that the first reflection coefficient curve satisfies the first preset condition, stop adjusting the first voltage.

15. The cryogenic probe of claim 8, wherein to adjust a second capacitance value of the second adjustable capacitor such that a second reflection coefficient curve corresponding to the second adjustable capacitor satisfies a second preset condition of the impedance tuning, the second control assembly is configured to:

update the second capacitance value of the second adjustable capacitor by adjusting a second voltage applied to the second adjustable capacitor;

determine whether the second reflection coefficient curve corresponding to the updated second capacitance value satisfies the second preset condition of the impedance tuning;

in response to determining that the second reflection coefficient curve does not satisfy the second preset condition, continue to adjust the second voltage to further update the second capacitance value; or in response to determining that the second reflection coefficient curve satisfies the second preset condition, stop adjusting the second voltage.

16. The cryogenic probe of claim 4, wherein the first coaxial cable includes a first inner core and a first outer conductor, and the second coaxial cable includes a second inner core and a second outer conductor;

a positive pole of the first power supply is connected to a negative pole of the first varactor assembly through the first inner core of the first coaxial cable, and a negative pole of the first power supply is connected to a positive pole of the first varactor assembly through the first outer conductor of the first coaxial cable;

a positive pole of the second power supply is connected to a negative pole of the second varactor assembly through the second inner core of the second coaxial cable, and a negative pole of the second power supply is connected to a second positive pole of the second varactor assembly through the second outer conductor of the second coaxial cable.

17. The device cryogenic probe of claim 14, wherein to determine whether the first reflection coefficient curve corresponding to the updated first capacitance value satisfies the first preset condition of the frequency tuning, the first control assembly is configured to:

obtain a sweep reflection coefficient curve generated after the receiving coil is swept, the sweep reflection coefficient curve including reflection coefficients of the receiving coil at different sweep frequencies;

generate the first reflection coefficient curve corresponding to the updated first capacitance value by updating, based on the updated first capacitance value, the sweep reflection coefficient curve; and determine whether the first reflection coefficient curve satisfies the first preset condition of the frequency tuning.

18. The cryogenic probe of claim 15, wherein to determine whether the second reflection coefficient curve corresponding to the updated second capacitance value satisfies the second preset condition of the impedance tuning, the second control assembly is configured to:

update one or more reflection coefficients of one or more plotted points in the first reflection coefficient curve based on the updated second capacitance value to generate the second reflection coefficient curve corresponding to the updated second capacitance value; and determine whether the second reflection coefficient curve and the second voltage satisfy the second preset condition of the impedance tuning.

19. The cryogenic probe of claim 15, wherein to update the second capacitance value of the second adjustable capacitor by adjusting a second voltage applied to the second adjustable capacitor, the second control assembly is configured to:

determine an initial upper limit voltage, an initial lower limit voltage, and an initial matching voltage based on a preset upper limit value and a preset lower limit value of the second voltage;

generate an updated matching voltage by updating the initial matching voltage based on an updated first reflection coefficient curve corresponding to each of the initial upper limit voltage, the initial lower limit voltage, and the initial matching voltage; and adjust the second voltage based on the updated matching voltage to update the second capacitance value.

20. The cryogenic probe of claim 19, wherein the second preset condition includes that: a lowest point in a second reflection coefficient curve corresponding to a matching voltage at a current moment is less than a first preset value, and an absolute value of a difference between the matching voltage at the current moment and a matching voltage at a last moment is less than a second preset value.

* * * * *